United States Patent
Arai et al.

(10) Patent No.: US 7,796,439 B2
(45) Date of Patent: Sep. 14, 2010

(54) SEMICONDUCTOR MEMORY DEVICE AND WRITE METHOD THEREOF

(75) Inventors: Fumitaka Arai, Yokohama (JP); Takeshi Kamigaichi, Yokohama (JP); Atsuhiro Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 12/017,543

(22) Filed: Jan. 22, 2008

(65) Prior Publication Data

US 2008/0181009 A1 Jul. 31, 2008

(30) Foreign Application Priority Data

Jan. 23, 2007 (JP) ............... 2007-012941

(51) Int. Cl.
G11C 11/34 (2006.01)
G11C 11/06 (2006.01)
(52) U.S. Cl. ................ 365/185.22; 365/185.17; 365/185.18; 365/185.24; 365/189.05
(58) Field of Classification Search ........... 365/185.17, 365/185.18, 185.22, 185.24, 189.09, 189.05
See application file for complete search history.

(56) References Cited

U.S. PATENT DOCUMENTS

| 6,031,760 | A | 2/2000 | Sakui et al. |
| 6,807,104 | B2 | 10/2004 | Arai et al. |
| 6,816,411 | B2 | 11/2004 | Arai et al. |
| 2003/0169630 | A1* | 9/2003 | Hosono et al. .............. 365/200 |
| 2003/0210576 | A1 | 11/2003 | Hwang et al. |
| 2004/0218437 | A1* | 11/2004 | Honda et al. ............... 365/200 |
| 2004/0264264 | A1* | 12/2004 | Yaegashi et al. ............ 365/199 |
| 2005/0253183 | A1 | 11/2005 | Umezawa et al. |
| 2006/0092708 | A1* | 5/2006 | Kawai et al. ........... 365/185.21 |
| 2007/0147122 | A1 | 6/2007 | Arai et al. |

FOREIGN PATENT DOCUMENTS

JP 2000-48582 2/2000

* cited by examiner

Primary Examiner—Tuan T Nguyen
Assistant Examiner—Toan Le
(74) Attorney, Agent, or Firm—Oblon, Spivak, McClelland, Maier & Neustadt, L.L.P.

(57) ABSTRACT

A semiconductor memory device includes a memory cell array, bit lines, a source line, a sense amplifier, a data buffer, a voltage generating circuit, and a control circuit, the control circuit being configured such that the control circuit writes batchwise the write data, in the plurality of memory cells of the bit lines, the control circuit, after the batchwise write, causes the plurality of first latch circuits to hold the write data once again, and the control circuit executes verify read from the memory cells, and executes, in a case where read data of the plurality of sense amplifier circuits by the verify read disagree with the write data that are held once again in the plurality of first latch circuits, additional write to write batchwise the held write data in the plurality of memory cells once again.

22 Claims, 16 Drawing Sheets

Initial stage of ST2 (Initial stage of verify write: source line noise is large)

At time of end of ST2 (At time of end of verify write: source line noise is small)

At time of end of ST2 (Initial stage of verify read: source line noise is large)

Initial stage of ST2 (Initial stage of verify read: source line noise is large)

At time of end of ST2 (At time of end of verify read: source line noise is small)

At time of end of ST2 (At time of end of verify read: source line noise is small)

ST5 (Additional write for source line src noise)

ST5 (Additional write)

ST3 (Data copy: second embodiment)

ST5 (Additional write: modification 1)

SEMICONDUCTOR MEMORY DEVICE AND WRITE METHOD THEREOF

CROSS-REFERENCE TO RELATED APPLICATIONS

This application is based upon and claims the benefit of priority from prior Japanese Patent Application No. 2007-012941, filed Jan. 23, 2007, the entire contents of which are incorporated herein by reference.

BACKGROUND OF THE INVENTION

1. Field of the Invention

The present invention relates to a semiconductor memory device and a write method thereof, and the invention is applied, for example, to a NAND flash memory.

2. Description of the Related Art

Conventionally, for example, in a NAND flash memory, there is a variance in write characteristics between memory cells due to shapes of processed memory cells in a fabrication process or due to a thermal process in fabrication. In a read operation of the NAND flash memory, a pass potential (Vpass) is also delivered to cells, which are not selected for data read, in a selected NAND string. Thus, even if there is such a variance in characteristics, it is necessary to execute precise control to set a write voltage (Vpgm) for all cells at a level lower than a read voltage (Vread).

Normally, in the NAND flash memory, in order to suppress the variance in write characteristics, a verify write operation is executed for each of memory cells (i.e. for each bit). In the verify write, after a write operation is performed, a verify read operation is first executed to determine whether a predetermined threshold value Vth is reached or not with respect to each memory cell (each bit). Subsequently, as regards only the memory cell which has been determined to be in a "deficient write" state by the verify read operation, verify write is executed once again. The verify write is executed by increasing, by a predetermined value, the voltage of a write pulse in a preceding verify write operation (step-up write).

In the verify read, a pass potential is delivered to a non-selected cell, and a determination potential is delivered to a selected cell. As a result, when a predetermined cell current flows, the data that is written in the memory cell is determined to be, for example, "0".

A cell current at this time is affected by various parasitic resistances, such as an internal resistance in a peripheral circuit, a bit line resistance, a bit line contact resistance, a diffusion layer resistance of a NAND string, a channel resistance of a non-selected cell, a source line contact resistance, and a source line resistance. Of these factors, the influence of source line noise, which occurs due to the source line parasitic resistance, is large.

The source line noise occurs due to a variation in electric current flowing in the source line. As regards the source line noise, when one page is accessed, the cell current varies in accordance with the variation in threshold voltage of the cell. Thus, the magnitude of cell current varies depending on the pattern of the threshold voltage Vth of neighboring cells. Accordingly, if the threshold voltage Vth of the neighboring cell varies, the read-out threshold voltage Vth of the cell also varies.

The influence of the source line noise conspicuously occurs at the initial stage of data write, that is, when verify read of a fast-write cell, in which data write is executed fast, is executed in the state in which the threshold voltage Vth of a late-write cell, for which data write is executed late, is still low (i.e. the cell current is large). In this case, at the time of the verify read, the potential drop of the source line is large, and the threshold voltage Vth of the cell is determined in the state in which the threshold voltage Vth appears to be high. Consequently, the cell is erroneously determined to meet the verify voltage.

On the other hand, when the write operation is close to the end, the threshold voltages of all cells in the page become close to predetermined threshold voltages. Thus, the potential drop of the source line decreases, the influence of the source line noise is small, and the verify voltage is close and the threshold voltage of each cell is determined. In the case of such a write operation, the above-mentioned erroneously determined cell (the fast-write cell) fails to meet the verify voltage. As a result, the threshold voltage that is set in the cell becomes lower than the predetermined threshold voltage, and the read margin decreases.

A publicly known document relating to the invention of the present application is Jpn. Pat. Appln. KOKAI Publication No. 2000-48582. Jpn. Pat. Appln. KOKAI Publication No. 2000-48582 discloses a semiconductor memory device relating to prevention of defective write due to rising of the potential of the common source line of memory cells.

BRIEF SUMMARY OF THE INVENTION

According to an aspect of the present invention, there is provided a semiconductor memory device comprising: a memory cell array having a plurality of memory cell strings, each of the memory cell string including a plurality of memory cells each having a charge accumulation layer and a control electrode which is connected to an associated word line, the plurality of memory cells having current paths connected in series; bit lines each being electrically connected to one end of the current path of the associated memory cell string; a source line which is electrically connected to the other end of the current path of the memory cell string; a sense amplifier including a plurality of sense amplifier circuits which are provided in association with the individual bit lines and are capable of reading out data which are written in the memory cells; a data buffer including a plurality of first latch circuits which are provided in association with the individual bit lines and electrically connected to the sense amplifier circuits, and are capable of holding data which are to be written in the memory cells; a voltage generating circuit which generates a write voltage; and a control circuit which controls the voltage generating circuit and the data buffer, the control circuit being configured such that the control circuit writes batchwise the write data, which are held in the plurality of first latch circuits, in the plurality of memory cells of the bit lines which are electrically connected to the plurality of first latch circuits, the control circuit, after the batchwise write, causes the plurality of first latch circuits to hold the write data once again, and the control circuit executes verify read from the memory cells, and executes, in a case where read data of the plurality of sense amplifier circuits by the verify read disagree with the write data that are held once again in the plurality of first latch circuits, additional write to write batchwise the held write data in the plurality of memory cells once again.

According to another aspect of the present invention, there is provided a write method of a semiconductor memory device, comprising: writing batchwise write data, which are held in a plurality of first latch circuits, in a plurality of memory cells of bit lines which are electrically connected to the plurality of first latch circuits; causing, after the batchwise write, the plurality of first latch circuits to hold the write data once again; executing verify read from the memory cells; and executing, in a case where read data of a plurality of sense amplifier circuits by the verify read disagree with the write data that are held once again in the plurality of first latch circuits, additional write to write batchwise the held write data in the plurality of memory cells once again.

DETAILED DESCRIPTION OF THE INVENTION

Figure 1:
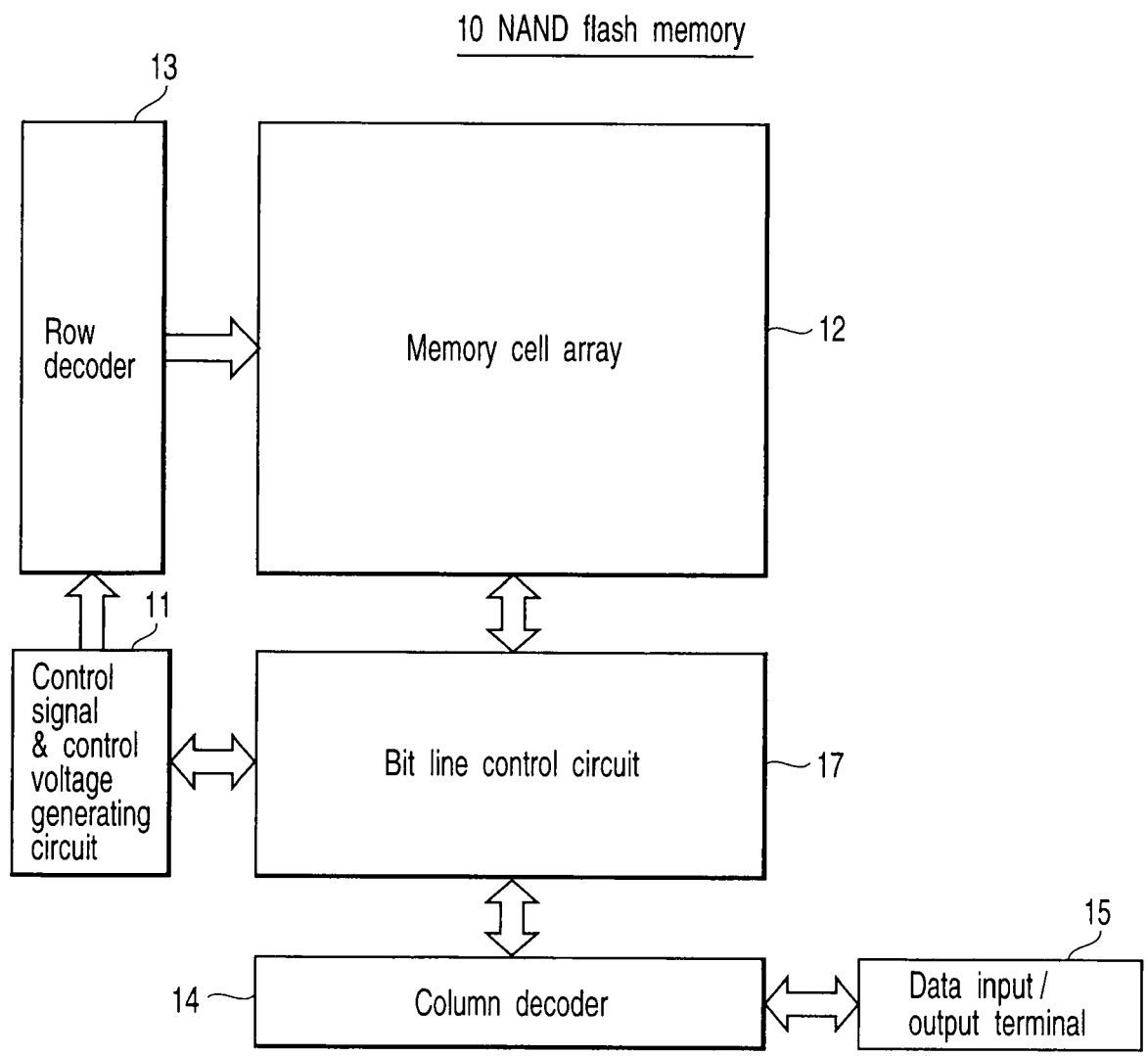
FIG. 1 is a block diagram showing a semiconductor memory device according to a first embodiment of the present invention.

Embodiments of the present invention will now be described with reference to the accompanying drawings.

In the description below, common parts are denoted by like reference numerals throughout the drawings.

First Embodiment

<1. Example of Whole Structure (NAND Flash Memory)>

Figure 2:
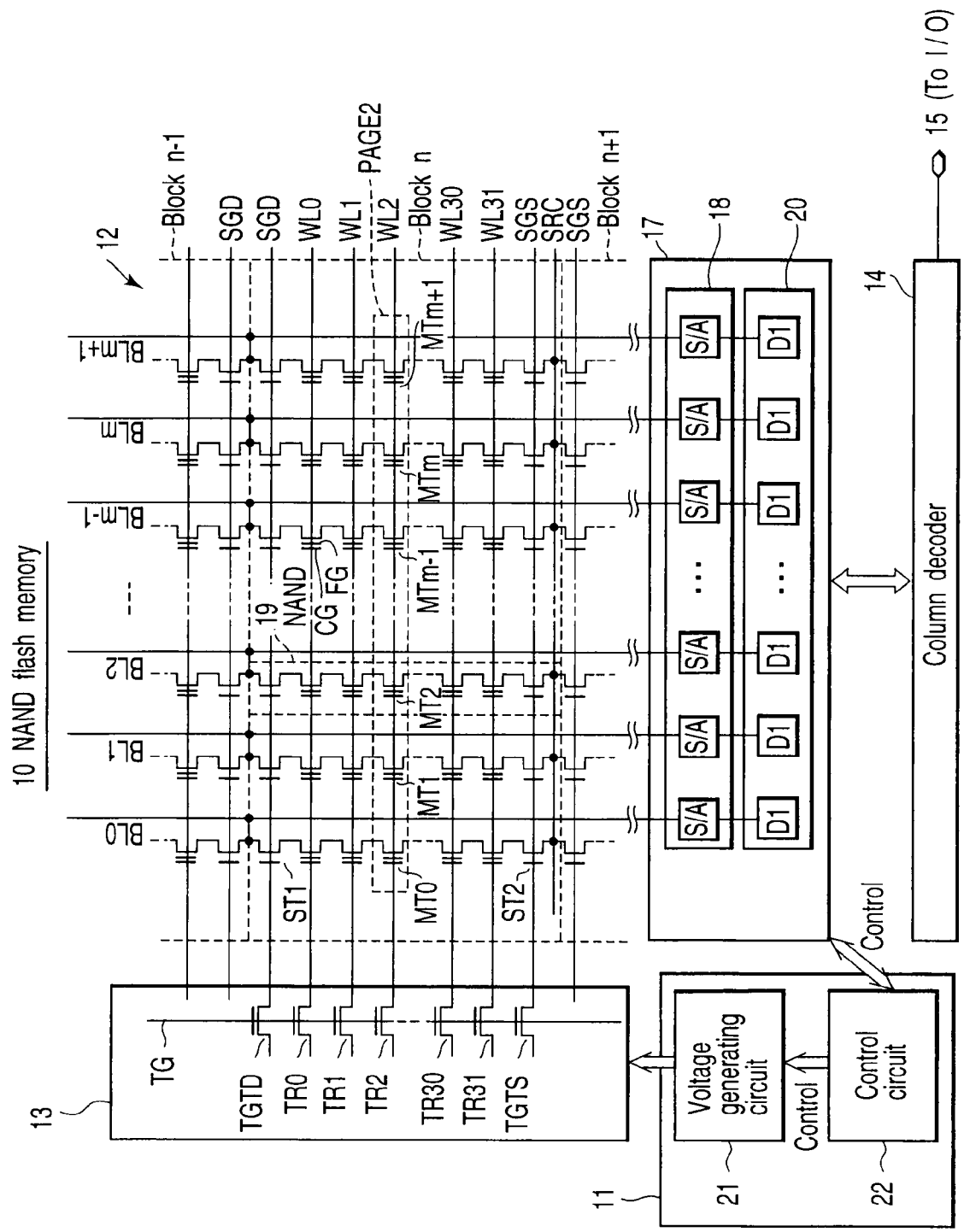
FIG. 2 is a block diagram showing the semiconductor memory device according to the first embodiment.

To begin with, referring to FIG. 1 and FIG. 2, an example of the entire structure of a semiconductor memory device according to a first embodiment of the invention is described. FIG. 1 and FIG. 2 are block diagrams showing a NAND flash memory 10 as the semiconductor memory device according to the present embodiment. In the description of this embodiment, a NAND flash memory is exemplified as a structure of the semiconductor memory device.

As is shown in FIG. 1, the NAND flash memory 10 according to this embodiment includes a control signal & control voltage generating circuit 11, a memory cell array 12, a row decoder 13, a column decoder 14, a data input/output terminal 15 and a bit line control circuit 17.

As shown in FIG. 2, the control signal & control voltage generating circuit 11 includes a voltage generating circuit 21 and a control circuit 22, and is configured to control the memory cell array 12, row decoder 13 and bit line control circuit 17. The control signal & control voltage generating circuit 11 is electrically connected to, for example, a control signal input terminal (not shown), and is controlled by, for example, a control signal ALE (address latch enable) which is input from a host device via the control signal input terminal.

The voltage generating circuit 21 is configured to generate a predetermined voltage, such as a write voltage Vpgm, under the control of the control circuit 22.

The control circuit 22 is configured to control the voltage generating circuit 21 and bit line control circuit 17.

The bit line control circuit 17 comprises a sense amplifier 18 and a data buffer 20. The sense amplifier 18 is composed of a plurality of sense amplifier circuits S/A which are connected to bit lines BL0 to BLm+1.

The data buffer 20 is composed of a plurality of first latch circuits D1 which are connected to the associated sense amplifiers S/A.

The column decoder 14 is connected to the bit line control circuit 17. The column decoder 14 is configured to supply write data, which is input from the data input/output terminal 15, to predetermined first latch circuits D1 in the data buffer 20.

The memory cell array 12 is composed of a plurality of blocks (Block n−1, Block n, Block n+1, . . . ). For example, each block (Block n−1, Block n, Block n+1, . . . ) is a single-level NAND flash memory which is configured as an SLC (Single Level Cell) area which is capable of recording 1-bit data in one memory cell transistor, MT0 to MTm+1. As will be described later in connection with a third embodiment of the invention, each block (Block n−1, Block n, Block n+1, . . . ) may be a multilevel NAND flash memory which is configured as an MLC (Multi Level Cell) area that is capable of recording multi-bit data in one memory cell transistor, MT0 to MTm+1.

In the case of the present embodiment, the block (Block n) includes a plurality of memory cell transistors MTC to MTm+1, which are arranged in a matrix at intersections between 32 word lines WL0 to WL31 and an (m+2) number of bit lines BL0 to BLm+1.

Each of the memory cell transistors MT0 to MTm+1 has a multilayer structure comprising a tunnel insulation film provided on a semiconductor substrate (e.g. a P-type silicon substrate); a floating electrode FG provided on the tunnel insulation film; an inter-gate insulation film provided on the floating electrode FG; and a control electrode CG provided on the inter-gate insulation film. The control electrodes CG of the memory cell transistors MT0 to MTm+1 in each row are commonly connected to an associated one of the word lines WL0 to WL31.

A plurality of memory cell transistors MT0 to MTm+1, which are connected to the associated word line, WL0 to WL31, constitute one page. For example, a plurality of memory cell transistors MT0 to MTm+1, which are connected to the word line WL that is indicated by a broken-line box in FIG. 2, constitute one page PAGE2.

Memory cell transistors, which are arranged in each column, have their sources/drains shared as their current paths. The current paths are connected in series at one end and the other end, and these memory cell transistors constitute a NAND cell string (memory cell string) 19. In this example, in the NAND cell string (memory cell string) 19, 32 memory cell transistors are connected. The NAND cell string (memory cell string) 19 is selected by select transistors ST1 and ST2.

The gates of the select transistors ST1 are commonly connected to a select gate SGD, and the gates of the select transistors ST2 are commonly connected to a select gate SGS. The drain of the select transistor ST1 is connected to one of the bit lines BL0 to BLm+1. The source of the select transistor ST2 is connected to a source line SRC.

The source line SRC is shared by blocks (Blocks) which neighbor in the bit line direction (column direction). For example, the source line SRC shown in FIG. 2 is shared by the block (Block n) and the block (Block n+1).

The number of memory cell transistors, which are arranged in the column direction, is not limited to 32, and may be 8 or 16, for instance. In addition, only one of the select transistors ST1 and ST2 may be provided if the select transistor is configured to be able to select the NAND cell string 19.

Since data is written and read in units of a page (PAGE), the page (PAGE) is a write unit and a read unit. An erase operation is performed batchwise in units of the block (Block n). Specifically, the erase operation is executed by applying an erase voltage Vera to all the control electrodes CG in the block (Block n−1 to Block n+1) and releasing electrons in the floating electrodes FG into the semiconductor substrate.

The row decoder 13 is electrically connected to the memory cell array 12, and is configured to select word lines WL0 to WL31 in the memory cell array 12 and to apply a voltage, which is necessary for read, write or erase, to the selected word line, WL0 to WL31. In the case of the present embodiment, the row decoder 13 includes transfer gate transistors TGTD and TGTS and transfer transistors TR0 to TR31, which have gates commonly connected to a transfer gate line TG. The transfer gate transistors TGTD and TGTS are connected to the select gate lines SGD and SGS. The transfer transistors TR0 to TR31 are configured to apply predetermined voltages, such as an erase voltage Vera, write voltage Vpgm, to the word lines WL0 to WL31.

The bit line control circuit 17 is configured to read data from the memory cell transistors MT0 to MTm+1 in the memory cell array 12 via the bit lines BL0 to BLm+1, to detect the states of the memory cell transistors MT0 to MTm+1 via the bit lines BL0 to BLm+1, and to write data in the memory cell transistors MT0 to MTm+1 by applying a write voltage to the memory cell transistors MT0 to MTm+1 via the bit lines BL0 to BLm+1.

Each first latch circuit D1 holds write data which is supplied from the column decoder 14. In addition, each first latch circuit D1 holds data from the memory cell transistors MT0 to MTm+1, which is read out by the sense amplifier 18. The data, which is held by each first latch circuit D1 of the data buffer 20, is output to the outside from the data input/output terminal 15 via the column decoder 14.

<2. Write Operation>

Next, a write operation of the semiconductor memory device according to the present embodiment is described with reference to FIG. 3 to FIG. 15. The description below is based on a flow chart of FIG. 3. In the description below, a case of writing data in one page (PAGE2), which is indicated by a broken-line box in the memory cell array 12, is exemplified.

(Step ST1 (Write Data Load))

Figure 3:
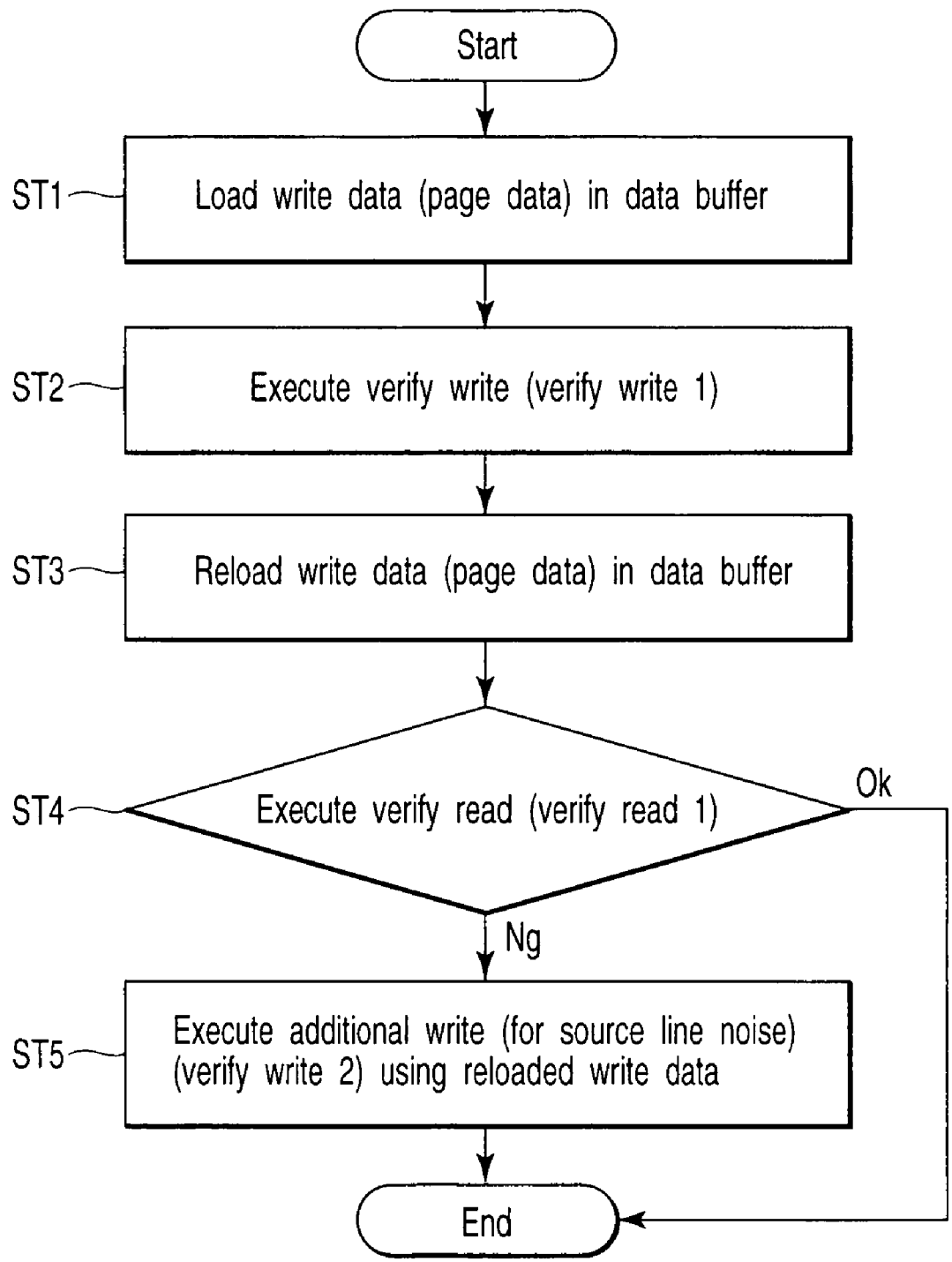
FIG. 3 is a flow chart illustrating a write operation of the semiconductor memory device according to the first embodiment.
Figure 4:
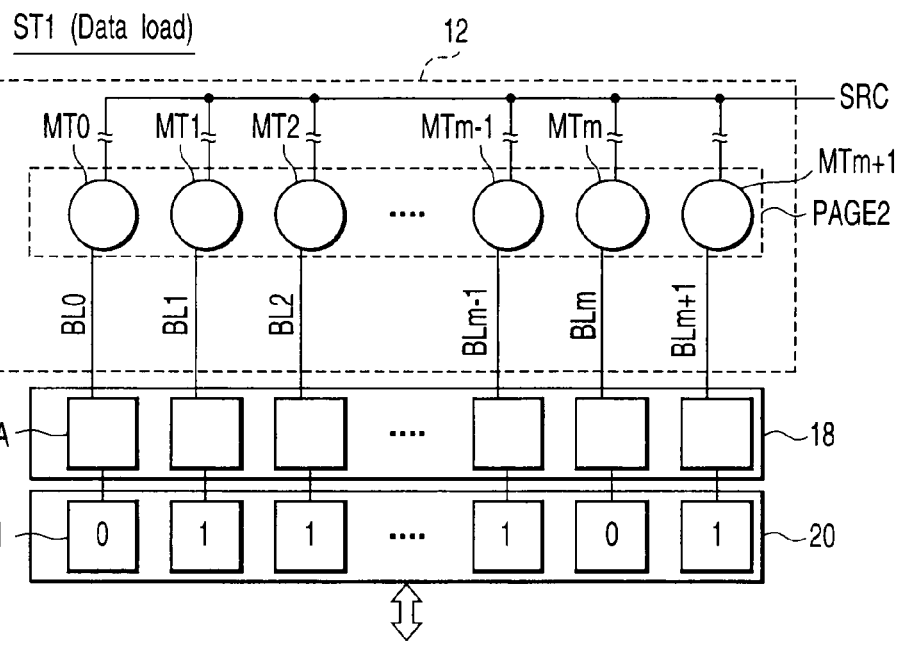
FIG. 4 is a block diagram for explaining step ST1 (data load) of the write operation in the first embodiment.

To start with, as shown in FIG. 3 and FIG. 4, the column decoder 14 controls the data buffer 20 so as to load write data (page data), which is input from the data input/output terminal 15, into arbitrary first latch circuits D1 (data load).

(Step ST2 (Verify Write))

Figure 5:
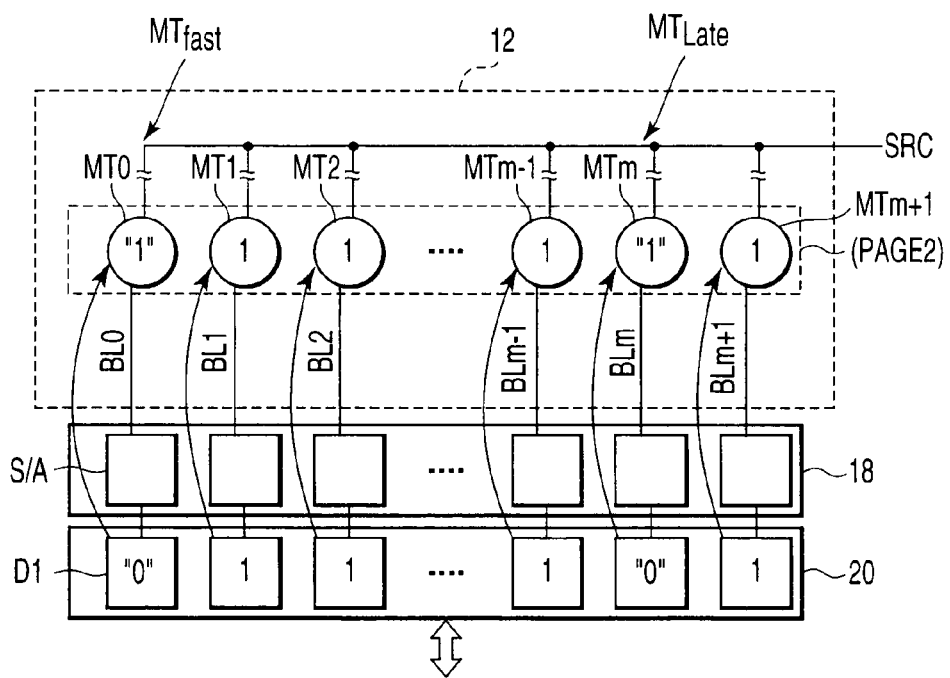
FIG. 5 is a block diagram for explaining step ST2 (verify write) of the write operation in the first embodiment.

Then, as shown in FIG. 5, the control circuit 22 causes the voltage generating circuit 21 to generate a predetermined write voltage Vpgm in accordance with the write data in the first latch circuits D1, thereby executing data write in the memory cell transistors MT0 to MTm+1 of the page PAGE2. To be more specific, the control circuit 22 applies a pass potential (Vpass) to non-selected cells of the selected NAND cell string, and executes control to render the current path of the NAND cell string 19 conductive. Then, the control circuit 22 executes control to apply a write voltage Vpgm to the write cell MT0 and MTm of the page PAGE2, and to inject electrons in the floating electrodes FG of the write cells MT0 and MTm ("0" write).

There is a variance in write characteristics between the respective memory cell transistors MT0 to MTm+1 due to variable factors such as cell shapes in a fabrication process or due to a thermal process in fabrication. The write cells MT0 to MTm+1 in the page PAGE2 include a fast-write cell group MTfast (e.g. memory cell transistor MT0) in which write is fast, and a late-write cell group MTlate (e.g. memory cell transistor MTm) in which write is late.

Figure 6:
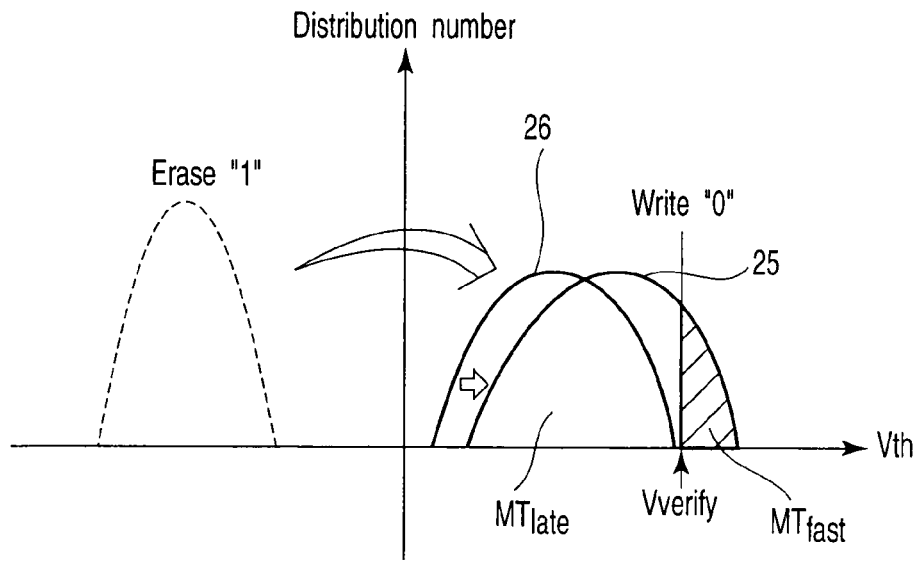
FIG. 6 shows a threshold distribution at an initial stage of step ST2 of the write operation in the first embodiment.

Then, verify read is executed to read out page data of the page PAGE2 batchwise. As shown in FIG. 6, at the initial stage of write, as described above, the source line noise is large, and a threshold distribution 25, which is measured by the sense amplifier S/A, is measured such that a threshold voltage Vth is greater than in an actual threshold distribution 26.

Thus, at the initial stage of write, the threshold voltage of the fast-write cell group MTfast (MT0) is erroneously determined to have exceeded a verify voltage Vverify (i.e. write is already completed). Hence, no verify write operation is executed for the fast-write cell group MTfast (MT0).

On the other hand, at the initial stage of step ST2, the threshold voltage of the late-write cell group MTlate (memory cell transistor MTm) has not yet exceeded the verify voltage Vverify, and the write operation is determined to be incomplete.

Figure 7:
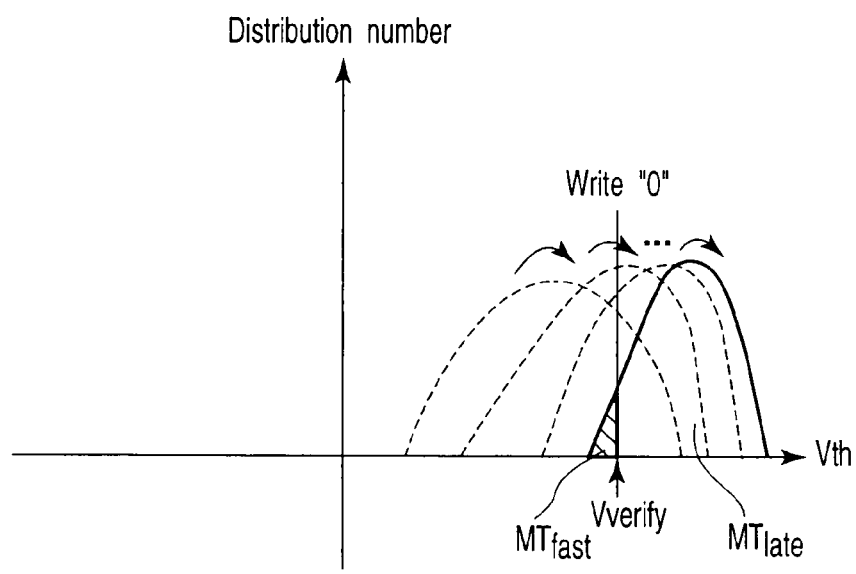
FIG. 7 shows a threshold distribution at a time of the end of step ST2 of the write operation in the first embodiment.

Thus, subsequently, as shown in FIG. 7, the same verify write and verify read as described above are repeatedly executed for the late-write cell group MTlate (MTm) until the predetermined verify voltage Vverify is reached. Specifically, as described above, verify read is executed to read page data batchwise into the sense amplifier S/A, and determines whether the predetermined verify voltage Vverify is reached or not on a bit-by-bit basis. The above-described verify write is executed only for the bit that has been determined to be in deficient write state. A write voltage that is applied at the time of the verify write is a write voltage (Vpgm+ΔVpgm) that is produced by adding to the write voltage Vpgm a voltage ΔVpgm with a step-up width, which is obtained by increasing, by a predetermined value, the pulse voltage of the write voltage Vpgm at the time of the preceding write. The degree of the increase of the write pulse voltage at the time of the verify write relates to the finally obtained distribution width of the threshold value Vth and the time that is needed to complete data write in all memory cell transistors MT, and is determined on the basis of necessary parameters.

However, at the time of the end of the write, since the source line noise is small, the threshold distribution that is measured by the sense amplifier circuit S/A substantially agrees with the actual threshold distribution. As a result, the threshold voltage of the late-write cell group MTlate (MTm) is exactly determined as a threshold voltage that has exceeded the predetermined verify voltage Vverify. Accordingly, since the influence of the source line noise on the late-write cell group MTlate (MTm) is small, erroneous determination as in the case of the fast-write cell group MTfast (MT0) does not easily occur.

By repeating the above-described verify write and verify read, the page PAGE2 is set to have a predetermined threshold distribution. However, as shown in FIG. 7, the fast-write cell group MTfast (MT0) is erroneously determined due to the source line noise, and fails to meet the verify voltage Vverify.

<Re: Source Line Noise>

Next, the source line noise, which occurs at the time of verify read in the above-described write operation (step ST2), is described in greater detail with reference to FIG. 8 to FIG. 12.

Since the source line noise occurs mainly due to the parasitic capacitance of the wiring resistance of the source line SRC, the source line noise varies depending on the magnitude of the cell current flowing in the source line SRC. As a result, at the time of verify read, the source line noise acts so as to increase the threshold voltage Vth of the fast-write cell group MTfast (MT0) in the determination by the sense amplifier circuit S/A.

Figure 8:
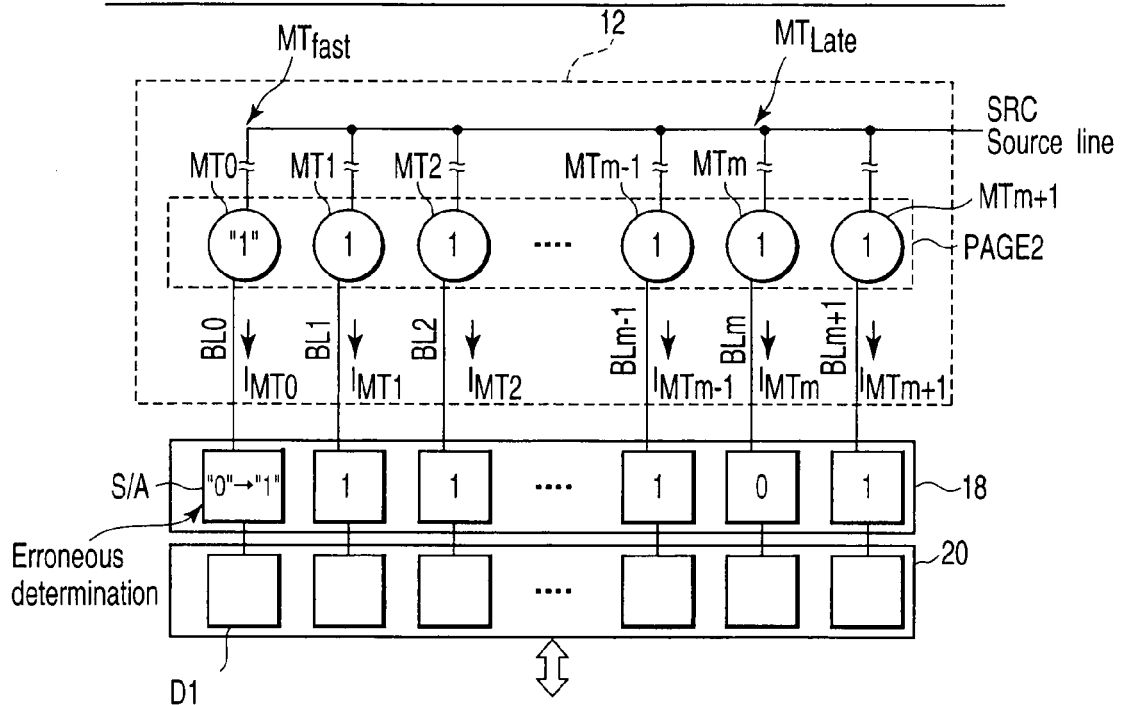
FIG. 8 is a block diagram for explaining verify read at an initial stage of step ST2 of the write operation in the first embodiment.

Specifically, as shown in FIG. 8, at the time of the verify read at the initial stage of step ST2, a predetermined voltage is first applied to the bit lines BL to BLm+1, thereby charging the bit lines BL to BLm+1. Then, a pass potential (Vpass) is applied to non-selected cells in the NAND cell string 19, and a determination voltage is applied to the control electrodes CG of selected cells MT0 to MTm+1 in the page PAGE2. Subsequently, cell currents in the current paths of the selected cells MT0 to MTm+1 are discharged to the bit lines BL to BLm+1, and it is determined whether the voltage of the bit lines BL to BLm+1 exceeds a predetermined determination voltage Vsense.

Figure 9:
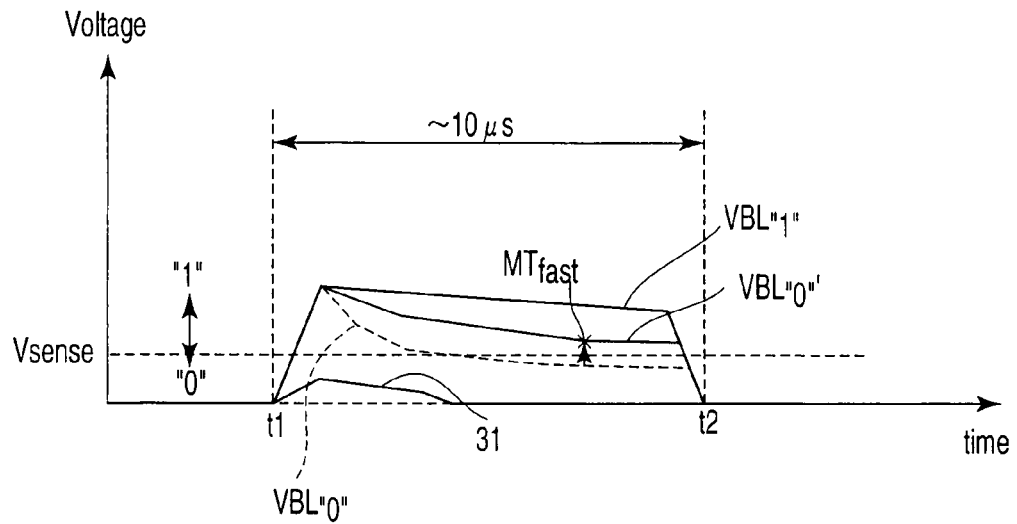
FIG. 9 shows a bit line voltage at an initial stage of step ST2 of the write operation in the first embodiment.

For example, FIG. 9 shows the voltages of the bit lines BL to BLm+1 at the time of the verify read at the initial stage of step ST2. As shown in FIG. 9, in the time period between time point t1 and time point t2, the sense amplifier circuit S/A measures the voltage drop of the bit line, BL0 to BLm+1, thereby determining whether the write in the memory cell transistor, MT0 to MTm+1, is completed or not.

Since the write in the neighboring memory cells MT1 to MTm+1 is not completed when the write in the fast-write cell group MTfast (MT0) ends, the verify read is executed in the state in which the threshold voltage Vth is still low and the cell current, IMT1 to IMTm+1, is large. Consequently, a great amount of cell current, IMT1 to IMTm+1, flows into the source line SRC, and a large source noise occurs. Hence, the voltage of the source line SRC is greatly raised.

Thus, as shown in FIG. 9, the 0 data bit line voltage VBL"0" (indicated by a solid line), by which the fast-write cell group MTfast (MT0) is determined, rises greatly in accordance with the great increase in voltage 31 of the source line SRC due to the source line noise. As a result, the 0 data bit line voltage VBL"0" exceeds the determination voltage Vsense. Accordingly, the fast-write cell group MTfast (MT0) is erroneously determined to be in the write completion state by the sense amplifier S/A, despite the data write being actually incomplete.

Thereafter, as shown in FIG. 8, the value of the sense amplifier circuit S/A, which is connected to the fast-write cell group MTfast(MT0), is inverted ("0"→"1") since the write completion is determined. Thus, thereafter, verify write is not executed in the fast-write cell group MTfast (MT0).

Figure 10:
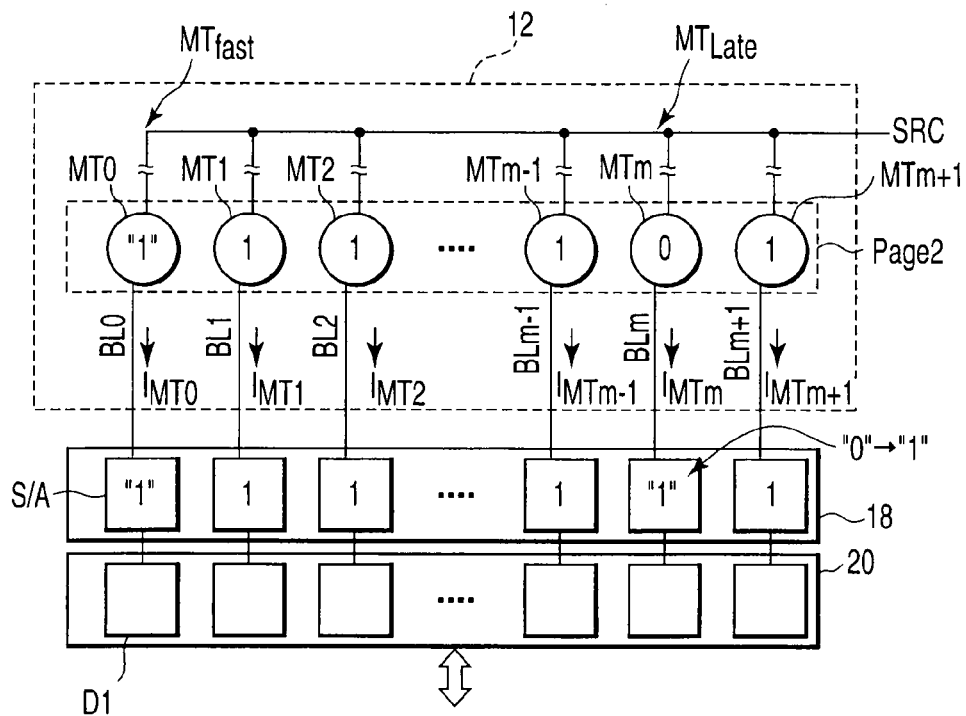
FIG. 10 is a block diagram for explaining verify read at a time of the end of step ST2 of the write operation in the first embodiment.

Subsequently, as shown in FIG. 10, when the write operation is completed (at the time of the end of step ST2), verify read is executed from the late-write cell group MTlate (MTm) in the state in which the write in the neighboring cells MT0 to MTm+1 is completed.

At this time, since the write in the neighboring cells MT0 to MTm+1 is completed, the verify read is executed in the state in which the threshold voltage Vth is high and the cell current, IMT0 to IMTm+1, is small. Hence, a small cell current, IMT0 to IMTm+1, flows into the source line SRC, large source line noise does not occur, and the width of increase of the voltage of the source line SRC is small.

Figure 11:
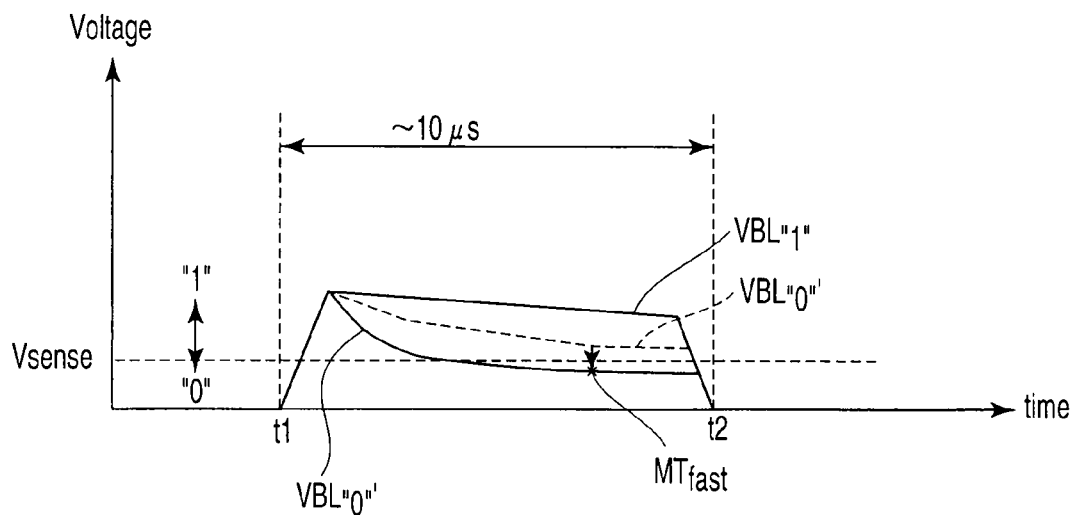
FIG. 11 shows a bit line voltage at a time of the end of step ST2 of the write operation in the first embodiment.

As shown in FIG. 11, since the voltage of the source line SRC does not greatly rise due to the source line noise, the late-write cell group MTlate (MTm) is determined by the 0 data bit line voltage VBL"0" (solid line) and is not erroneously determined by the sense amplifier circuit S/A.

On the other hand, if the verify read is executed at this time, the fast-write cell group MTfast (MT0) is determined by the 0 data bit line voltage VBL"0" (solid line) that is varied from the 0 data bit line voltage VBL"0"' (broken line), and it is determined that the write is not completed.

To cope with this, additional write (for source line noise) is executed according to steps ST3 to ST5 (to be described below), and the read margin is increased.

As has been described above, the magnitude of the source line noise varies due to the value of the cell current, IMT0 to IMTm+1. Specifically, as regards the source line noise, the value of the voltage drop is determined by the magnitude of the flowing cell current, IMT0 to IMTm+1. Thus, the degree of the increase of the source line voltage 31 according to the magnitude of the source line noise depends on the write data pattern of the neighboring memory cell transistor MT0 to MTm+1. The write data pattern of the memory cell transistor MT0 to MTm+1, which determines the magnitude of the source line noise, is determined by external addresses, etc. It is thus difficult to estimate the magnitude of source line noise in advance.

(Step ST3 (Write Data Reload))

Figure 12:
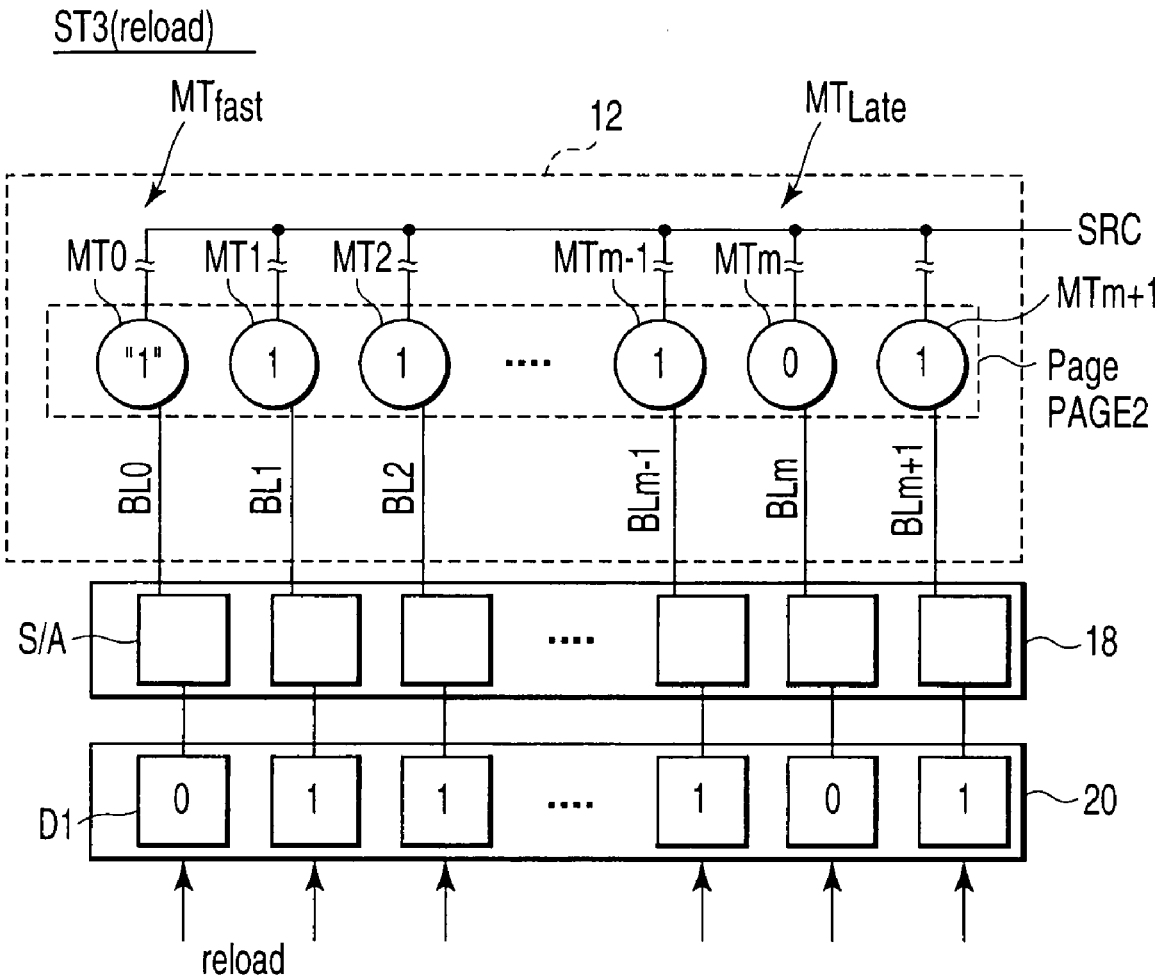
FIG. 12 is a block diagram for explaining step ST3 (reload) of the write operation in the first embodiment.

Subsequently, in step ST3, as shown in FIG. 12, the control circuit 22 controls the data buffer 20 so as to reload the write data (page data) from the input/output terminal 15 into the first latch circuits D1 (reload).

(Step ST4 (Verify Read 1))

Figure 13:
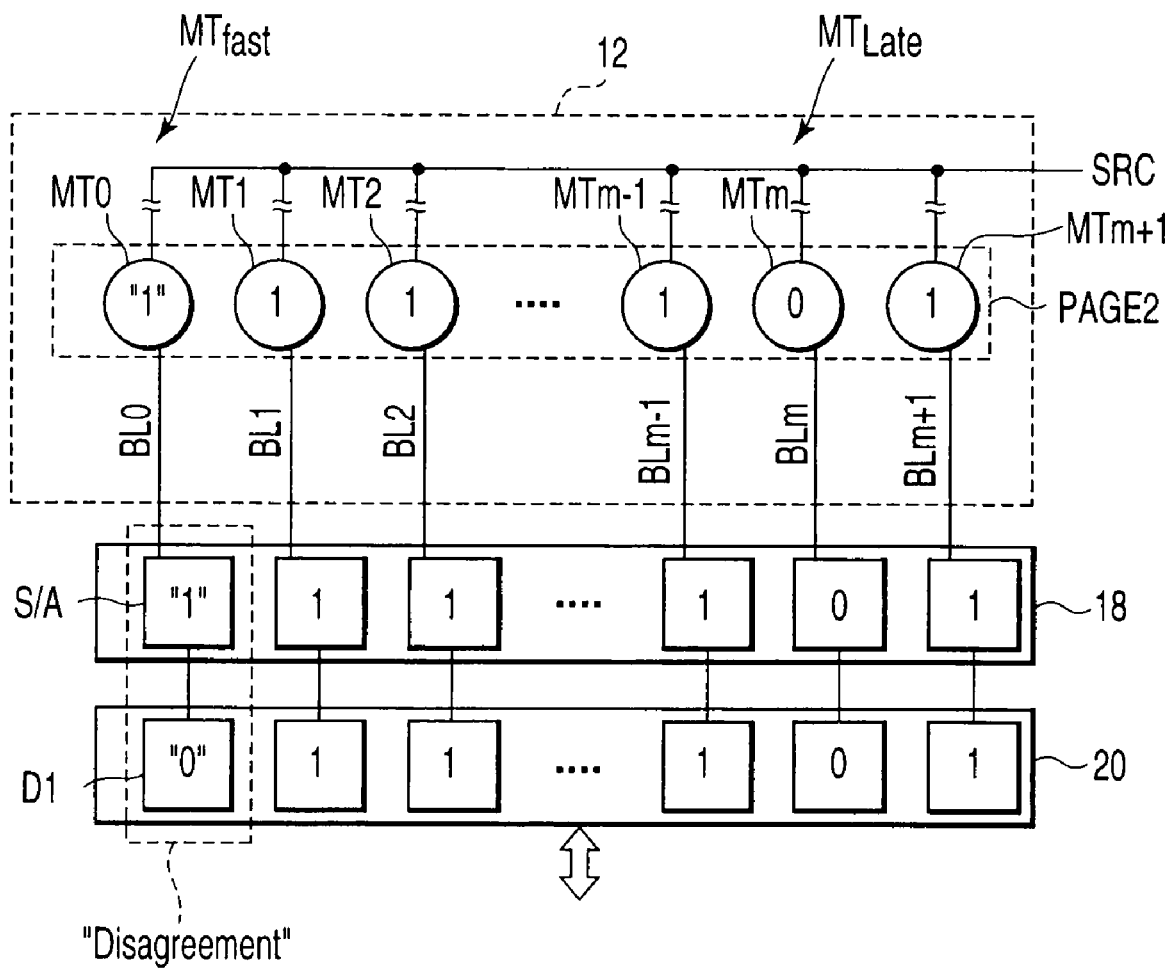
FIG. 13 is a block diagram for explaining step ST4 (verify read) of the write operation in the first embodiment.

Subsequently, as shown in FIG. 13, in step ST4, the same verify read as described above is executed. For example, the write data of the memory transistors MT0 to MTm+1 of the page PAGE2 is read out into the sense amplifier S/A, and verify read is executed.

In the case where the read-out threshold voltage Vth meets the predetermined verify voltage Vverify, the write operation is finished without executing subsequent additional write (for source line noise) (ST5). The degree of the increase of the source line voltage 31 according to the magnitude of the source line noise depends on the write data pattern of the neighboring memory cell transistors MT0 to MTm+1. Thus, depending on the write data pattern, there is a case in which even the fast-write cell group MTfast (MT0) is not erroneously determined.

On the other hand, in the case where the read-out threshold voltage Vth fails to meet the predetermined verify voltage Vverify owing to the source line noise, the additional write (for source line noise) (ST5) is executed as described below. In the case of the present embodiment, the value "1" of the sense amplifier S/A, which is the read data value of the fast-write cell group MTfast (MT0), does not agree with the value "0" of the first latch circuit D1 which is reloaded in step ST3. Thus, the threshold voltage Vth fails to meet the predetermined verify voltage Vverify. (Step ST5 (additional write for source line noise (Verify Write 2)))

Figure 14:
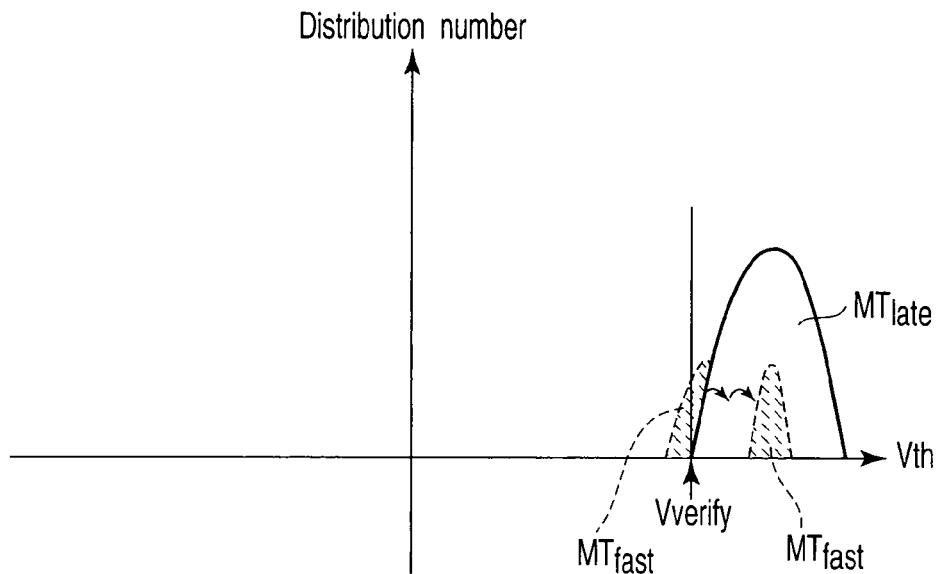
FIG. 14 shows a threshold distribution at a time of step ST5 of the write operation in the first embodiment.

Subsequently, as shown in FIG. 14, the control circuit 22 controls the voltage value of the voltage generating circuit 21 in accordance with the reloaded write data in the first latch circuit D1 in step ST3, and executes batchwise the additional verify write in the memory cell transistors MT0 to MTm+1 of the page PAGE2 in the same manner as described above. Then, similar verify read is executed. In this manner, the additional verify write and verify read are repeated until the memory cell transistors MT0 to MTm+1 of the page PAGE2 meet the verify voltage.

As a result, the threshold voltage Vth of the fast-write cell MTfast (MT0), which is indicated by a broken line in FIG. 14, can be increased up to a threshold that meets the predetermined verify voltage Vverify.

Figure 15:
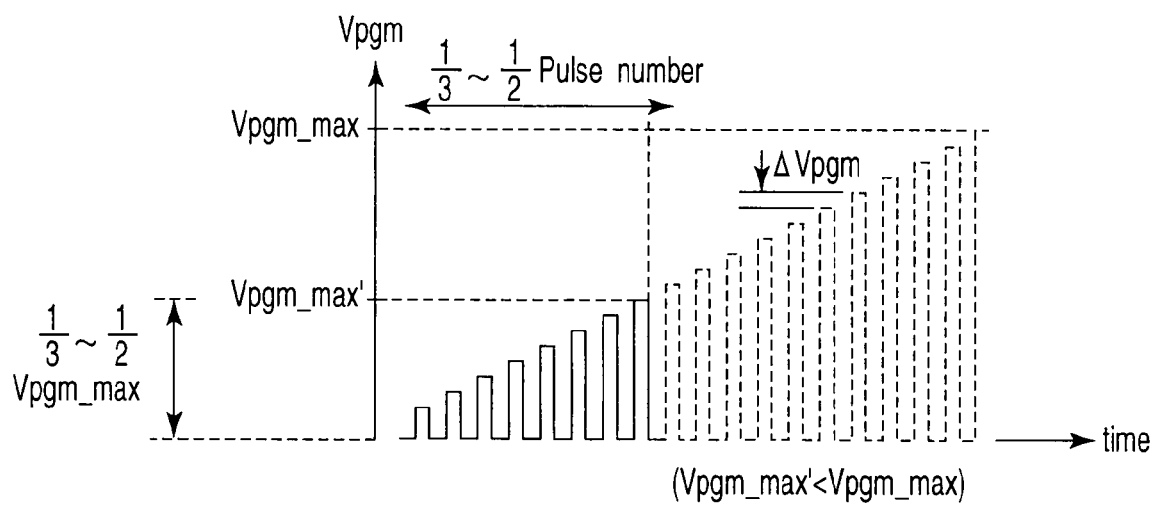
FIG. 15 shows a write voltage at a time of step ST5 of the write operation in the first embodiment.

In addition, as shown in FIG. 15, at the time of the additional write (step ST5), the maximum value Vpgm_max' (or the number of application of pulses) of the write voltage Vpgm can be made lower than in the verify write (step ST2) (maximum voltage value Vpgm_max'<maximum voltage value Vpgm_max). Thus, the write time that is necessary for the additional write (step ST5) can be made less than the write time for the verify write (step ST2). Thereby, the increased time of the write operation due to the additional write (step ST5) can be reduced to a minimum. For example, in the case of the present embodiment, the maximum Vpgm_max' (number of application of pulses) of the write voltage at the time of the additional write (step ST5) can be reduced to about ⅓ to ½ of the maximum Vpgm_max (number of application of pulses) of the write voltage at the time of the verify write (step ST2).

The reason for this is that the write is fast in the cell group MTfast (MT0 in this embodiment) and the influence of the source line noise is more conspicuous upon the fast-write cell group MTfast (MT0 in this embodiment). On the other hand, since the late-write cell group MTlate (MTm in this embodiment) has late write characteristics, the shift of the threshold distribution Vth of the late-write cell group MTlate (MTm) is small. As a result, only the threshold distribution Vth of the fast-write cell group MTfast (MT0) can be shifted so as to meet the predetermined verify voltage Vverify, and the entire shift of the threshold distribution Vth in the additional write ST5 can be decreased. Therefore, degradation in reliability can be prevented.

<3. Advantageous effects of the present embodiment>

According to the semiconductor memory device of the present embodiment and the write method thereof, at least the following advantageous effects (1) to (3) can be obtained.

(1) Even when source line noise occurs, the read margin can be increased.

As has been described above, the semiconductor memory device of the present embodiment includes the control circuit 22. The control circuit 22 writes batchwise the write data, which is held in the plural first latch circuits D1 (ST1), into the plural memory cells MT0 to MTm+1 of the bit lines BL0 to BLm+1 which are electrically connected to the plural first latch circuit D1 (ST2). Following the batchwise data write, the write data is held in the plural first latch circuit D1 once again (ST3). Then, verify read is executed from the memory cells MT0 to MTm+1. If the read data of the plural sense amplifiers D1 by the verify read do not agree with the write data that are held once again in the plural first latch circuit (ST5), the held write data can be written batchwise in the plural memory cells MT0 to MTm+1 once again (ST5).

Thus, as shown in FIG. 14, the threshold voltage Vth of the fast-write cell MTfast (MT0 in this embodiment), which is erroneously determined due to source line noise, can be increased up to a threshold voltage that meets the predetermined verify voltage Vverify.

Figure 16:
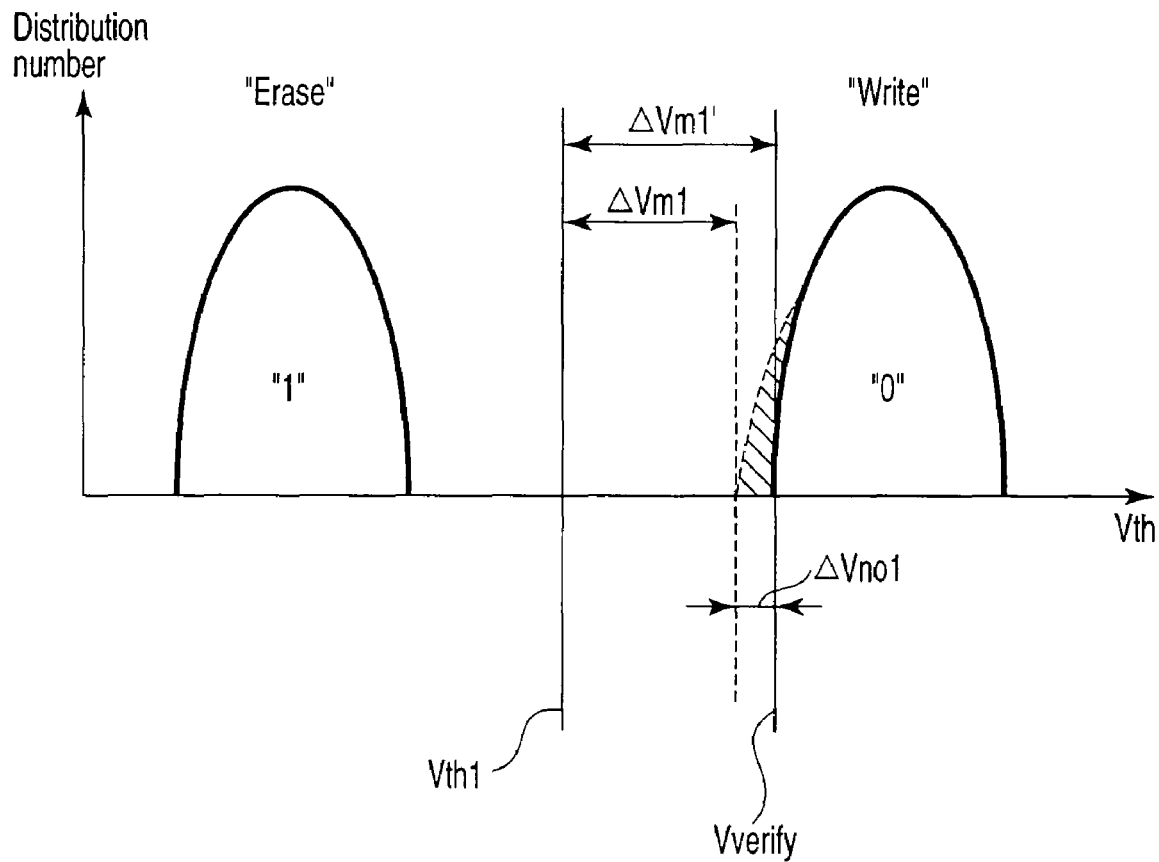
FIG. 16 shows a threshold distribution at a time of a read operation of the semiconductor memory device according to the first embodiment.

As a result, as shown in FIG. 16, the page read operation can be executed in the state in which a noise voltage ΔVno1 due to source line noise is eliminated.

Thus, the read margin voltage can be increased from a margin voltage ΔVm1 to a margin voltage ΔVm1'.

For example, in the case where the memory cell array 12 is configured as a single-level NAND flash memory as in the present embodiment, the ratio of the increase of the read margin is noise voltage value ΔVno1/margin voltage value ΔVm1' and is about 10%.

On the other hand, as will be described later in connection with a third embodiment of the invention, in the case where the memory cell array 12 is configured as a multilevel NAND flash memory, the margin voltage between threshold distributions becomes smaller, but the magnitude of the noise voltage ΔVno1 is unchanged. Therefore, the ratio of the increase of the read margin can be increased.

The magnitude of the voltage increase 31 of the source line SRC due to the source line noise is unpredictable since it depends on the write data pattern of the memory cell transistor MT0 to MTm+1 of the page. Thus, even in the case where the source line noise has occurred, it is effective to perform the additional write operation (ST5), as in the present embodiment, in order to increase the read margin.

With the development in microfabrication of the memory cell transistor MT0 to MTm+1 and the increase in capacity of the memory cell array 12, the number of cells, which are disposed in the same page, increases, and the influence of the increase of threshold voltage Vth (back-bias effect) of the cell gradually increases when the source line potential rises. Hence, the influence of the source line noise will increase. Thus, the present invention is advantageous to the microfabrication of the memory cell transistor MT0 to MTm+1 and the increase in capacity of the memory cell array 12.

(2) The write time for additional write (step ST5) can be decreased.

In addition, as shown in FIG. 15, at the time of the additional write (step ST5), the maximum value Vpgm_max' (the number of times of application) of the write voltage Vpgm can be made lower than in the verify write (step ST2). Thus, the write time that is necessary for the additional write (step ST5) can be decreased. Thereby, the increased time of the write operation due to the additional write (step ST5) can be reduced to a minimum.

The reason for this is that the influence of the source line noise is more conspicuous upon the fast-write cell group MTfast (MT0), and the write is fast in the cell group MTfast (MT0). On the other hand, since the late-write cell group MTlate (MTm in this embodiment) have late write characteristics, the shift of the threshold distribution Vth of the late-write cell group MTlate (MTm) is small. As a result, only the threshold distribution of the fast-write cell group MTfast (MT0) can be shifted so as to meet the predetermined verify voltage Vverify, and the entire shift of the threshold distribution Vth in the additional write ST5 can be decreased. Therefore, degradation in reliability can be prevented.

(3) The manufacturing cost can advantageously be reduced.

In the case where the source line noise is to be reduced, it is thinkable to apply lining to the source line SRC, thereby to reduce the resistance value of the source line SRC. However, if the lining for reducing the resistance value is applied to the source line SRC, an additional fabrication process therefor is required, leading to an increase in manufacturing cost.

In the case of the present embodiment, since there is no need to apply such lining to the source line, the source line noise can be reduced without performing such an additional fabrication process, and the manufacturing cost can advantageously be reduced.

Second Embodiment

An Example Including Additional Data Latch Circuits

Next, a semiconductor memory device according to a second embodiment of the invention is described with reference to FIG. 17 to FIG. 19. The second embodiment relates to an example including second data latch circuits D2. A detailed description of the parts common to those in the first embodiment is omitted.

<Example of Structure>

Figure 17:
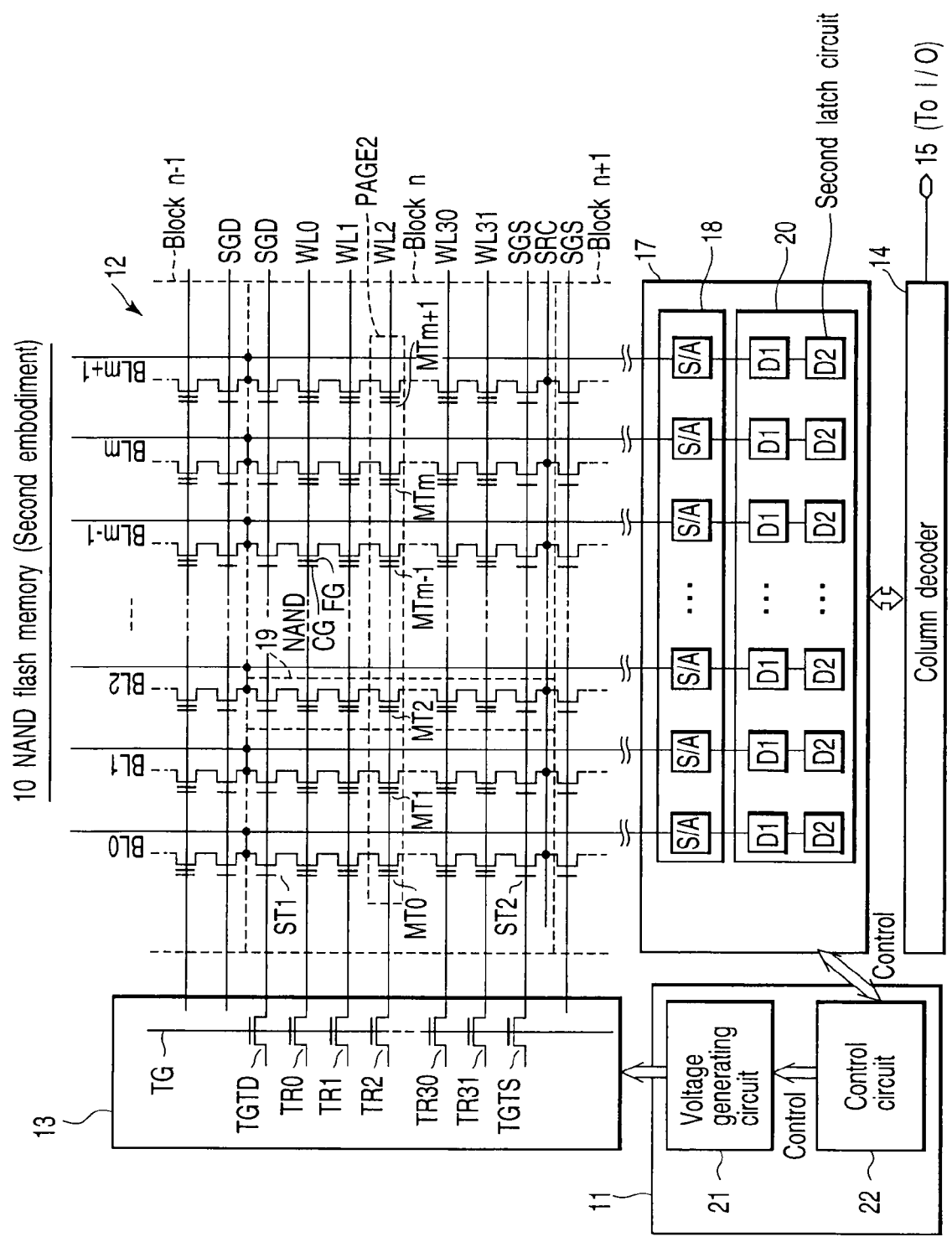
FIG. 17 is a block diagram showing a semiconductor memory device according to a second embodiment of the present invention.
Figure 18:
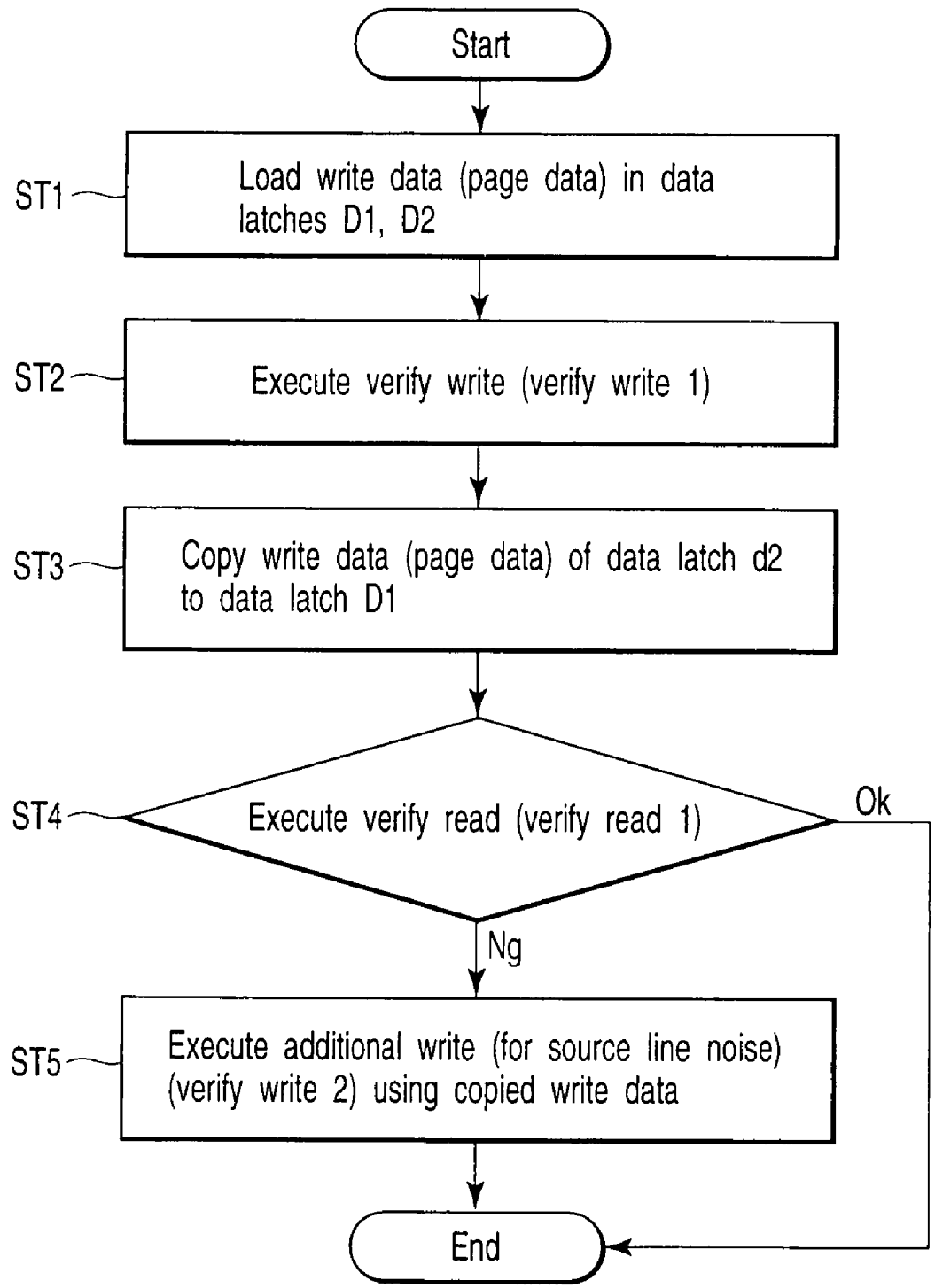
FIG. 18 is a flow chart illustrating a write operation of the semiconductor memory device according to the second embodiment.

As shown in FIG. 17, the semiconductor memory device according to the second embodiment differs from the first embodiment in that the data buffer 20 further includes second latch circuits D2.

Each of the second latch circuits D2 has an input electrically connected to the column decoder 14, and has an output connected to the input of the associated first latch circuit D1.

<Write Operation>

Next, the write operation of the semiconductor memory device according to the present embodiment is described. The description below is based on a flow chart of FIG. 18. This embodiment differs from the first embodiment in that the write data is loaded into the first and second latch circuits D1 and D2 in step ST1, and the write data (page data) in the second latch circuits D2 is copied to the first latch circuit D1 in step ST3.

(Step ST3 (Write Data Copy (Data Latch D2→ Data Latch D1)))

Figure 19:
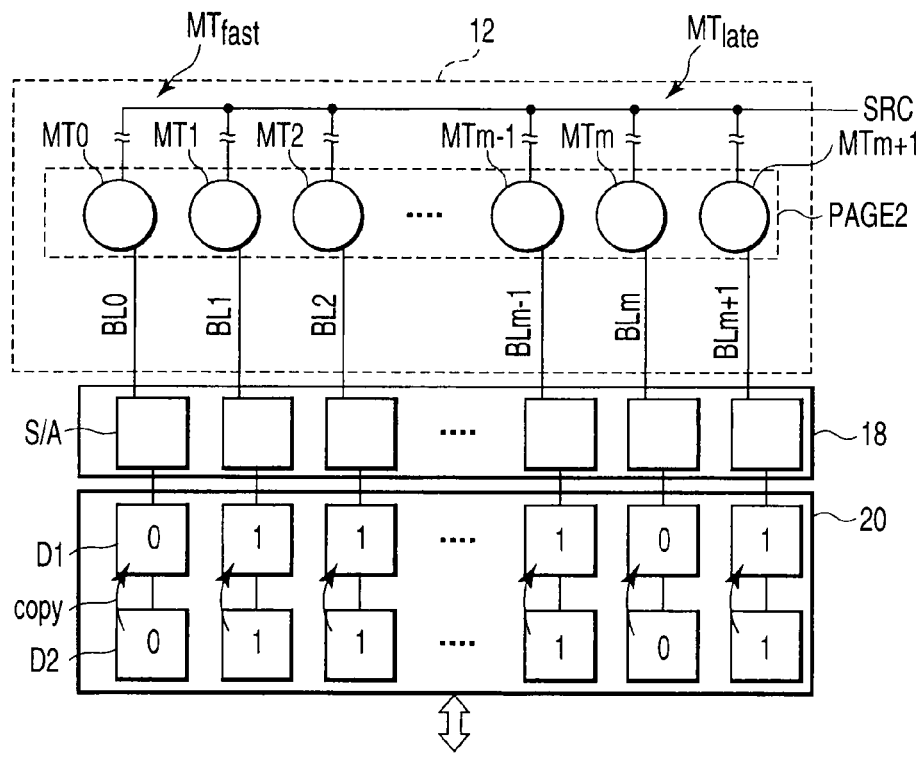
FIG. 19 is a block diagram for explaining step ST3 (data copy) of the write operation in the second embodiment.

As shown in FIG. 19, in step ST3, the control circuit 22 controls the data buffer 20 so that the write data that is held in the second latch circuits D2 is copied to the first latch circuits D1 (data copy).

The reason for this is that even after the verify write (step ST2), the write data is held in the second latch circuits D2. Thus, the high-speed write can advantageously be executed since there is no need to load the write data (page data) once again from the data input/output terminal 15 into the first latch circuits D1.

According to the semiconductor memory device of this embodiment and the write method thereof, the same advantageous effects (1) to (3) as described above can be obtained. Furthermore, according to the present embodiment, at least the following advantageous effect (4) can be obtained.

(4) High-speed write can advantageously be executed.

The semiconductor memory device according to the present embodiment further includes the second latch circuits D2 in the data buffer 20.

Thus, in step ST3, the write data that is held in the second latch circuits D2 can be copied to the first latch circuits D1. As a result, high-speed write can advantageously be performed since there is no need to load the write data (page data) once again from the data input/output terminal 15 into the first latch circuits D1.

Modification 1

An Example in Which the Step-Up Width is Increased

Next, a semiconductor memory device according to Modification 1 is described with reference to FIG. 20. Modification 1 relates to an example in which the step-up width Δpgm of the write voltage is increased. A detailed description of the parts common to those in the first embodiment is omitted.

Figure 20:
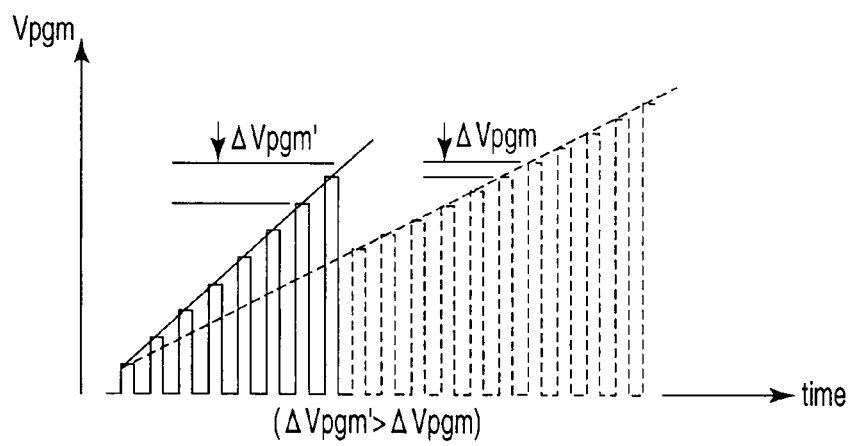
FIG. 20 shows a write voltage at a time of step ST5 of a write operation in Modification 1 of the present invention.

As shown in FIG. 20, Modification 1 differs from the first embodiment in that at the time of the additional write (for source line noise) (step ST5), the control circuit 22 controls the voltage generating circuit 21 so as to make the step-up width Δpgm' greater. The step-up width Δpgm', which is indicated by a solid line in FIG. 20, is controlled to become greater than the step-up width Δpgm relating to the first embodiment (Δpgm'>Δpgm).

According to the semiconductor memory device of Modification 1 and the write method thereof, the same advantageous effects (1) to (3) as described above can be obtained.

Furthermore, Modification 1 differs from the first embodiment in that at the time of step ST5 (the additional write for reducing source line noise), the control circuit 22 controls the voltage generating circuit 21 so as to make the step-up width Δpgm' greater.

The reason for this is that the influence of the source line noise is more conspicuous upon the fast-write cell group MTfast near the verify voltage Vverify, and the verify voltage Vverify is easily exceeded in the cell group MTfast near the verify voltage Vverify. Thus, the predetermined threshold voltage Vth can be met even in the case where the step-up width ΔVpgm' is increased (i.e. rough data write is executed).

Therefore, compared to the first embodiment, the write time at the time of additional write (step ST5) can be made shorter.

Modification 2

An Example Further Including a Verify Read Step

Next, a semiconductor memory device according to Modification 2 is described with reference to FIG. 21. Modification 2 relates to an example which further includes a verify read step ST6. A detailed description of the parts common to those in the first embodiment is omitted.

Figure 21:
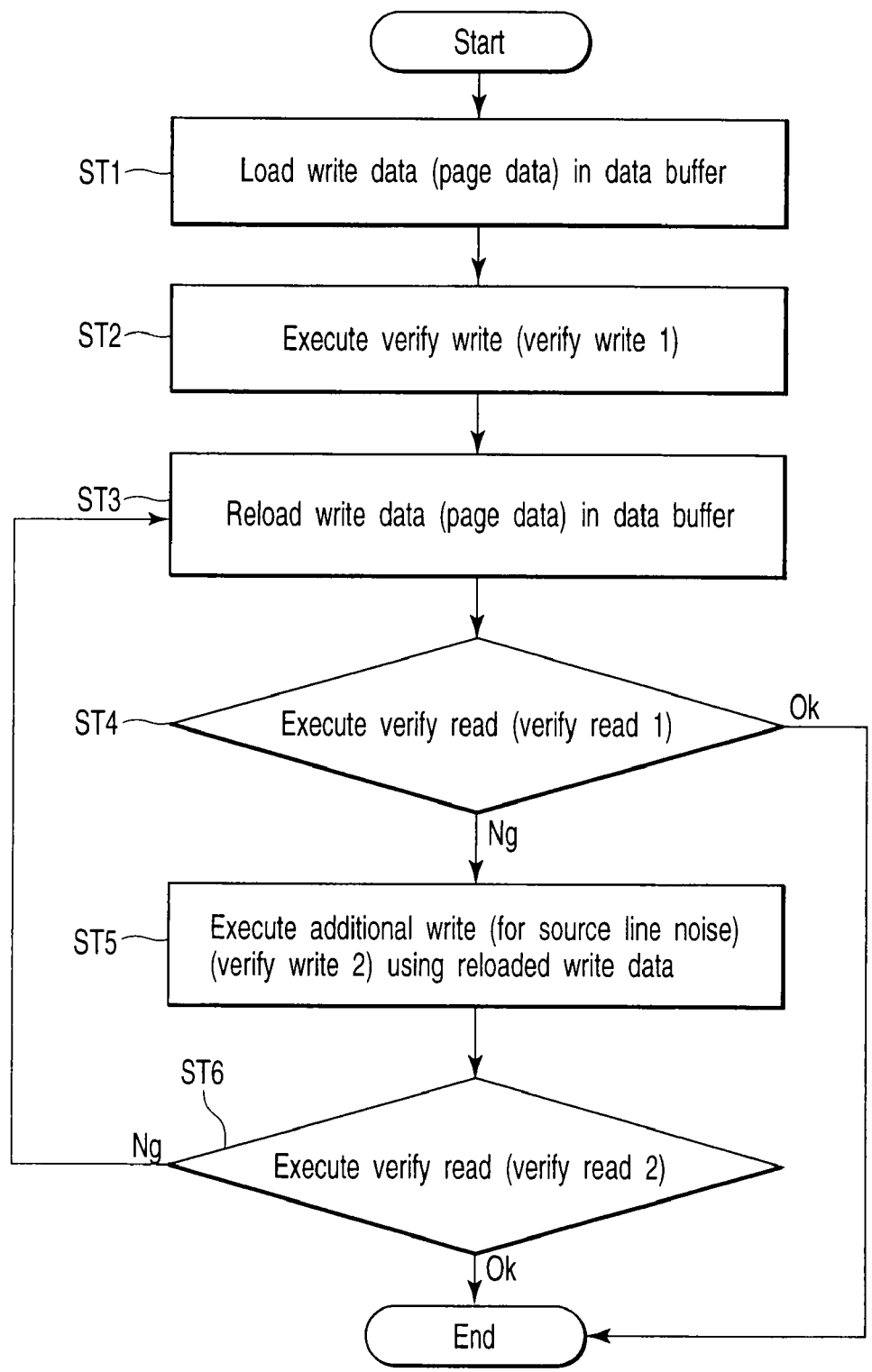
FIG. 21 is a flow chart illustrating a write operation of a semiconductor memory device according to Modification 2 of the invention.

As shown in FIG. 21, the write operation of the semiconductor according to Modification 2 differs from the first embodiment in that a verify read step ST6 is further provided.

(Step ST6 (Verify Read (Verify Read 2)))

Following step ST5, the sense amplifier S/A executes verify read (Verify Read 2). For example, the write data in the memory transistors MT0 to MTm of the page PAGE2 are read out into the latch circuits D1 of the sense amplifier S/A, and verify read is executed once again.

If the read-out threshold voltage Vth meets the predetermined verify voltage Vverify, the write operation is finished.

On the other hand, if the read-out threshold voltage Vth fails to meet the predetermined verify voltage Vverify, the additional write for reducing the source line noise is executed (ST3 to ST5).

According to the semiconductor memory device of Modification 2 and the write method thereof, the same advantageous effects (1) to (3) as described above can be obtained.

Furthermore, the write operation of the semiconductor memory device according to Modification 2 includes the verify read step ST6. Thus, even in the case where the threshold voltage Vth, which is read out in step ST6, has not yet met the predetermined verify voltage Vverify, the additional write for reducing the source line noise (ST3 to ST5) can be executed. As a result, the read margin can further be reduced, and the reliability can advantageously be enhanced.

Third Embodiment

An Example of a Multilevel NAND Flash Memory

Next, a semiconductor memory device according to a third embodiment of the present invention will now be described with reference to FIG. 22. The third embodiment relates to an example in which the semiconductor memory device is a multilevel NAND flash memory wherein a memory cell array 12 is configured as an MLC (multilevel cell) area which can record multi-bit data in one memory cell transistor, MT0 to MTm+1. A detailed description of the parts common to those in the first embodiment is omitted.

In the description of the first embodiment, the semiconductor memory device in which the memory cell array 12 is configured as the single-level NAND flash memory has been described by way of example. However, the semiconductor memory device is not limited to the single-level NAND flash memory, and the invention is similarly applicable to a multilevel NAND flash memory, and the ratio of the increase of the read margin can be increased. The third embodiment is an example in which the memory cell array 12 is configured as the multilevel NAND flash memory. A 4-value NAND flash memory is described as an example of the multilevel NAND flash memory.

Figure 22:
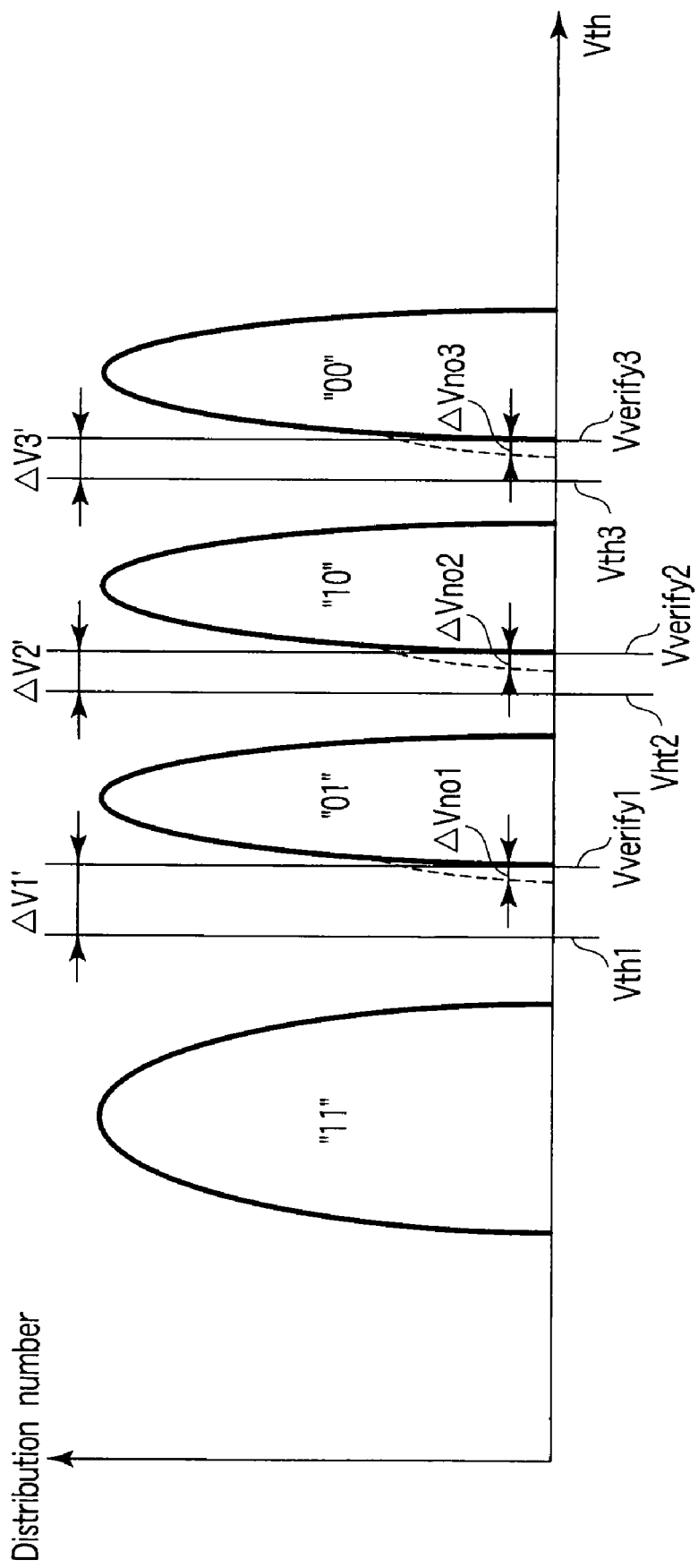
FIG. 22 shows a threshold distribution at a time of a read operation of a semiconductor memory device according to a third embodiment of the invention.

FIG. 22 shows the threshold distribution of the multilevel NAND flash memory according to the present embodiment. As shown in FIG. 22, the memory cell transistors MT0 to MTm+1 of this embodiment can store four data, "11", "01", "10" and "00", in an order from the lowest threshold voltage Vth. The threshold voltage Vth of the memory cell transistor, MT0 to MTm+1, which stores the "11" data, is Vth<Vth1 (0 V in this example). The threshold voltage Vth of the memory cell transistor, MT0 to MTm+1, which stores the "01" data, is Vth1<Vth<Vth2. The threshold voltage Vth of the memory cell transistor, which stores the "10" data, is Vth2<Vth<Vth3. The threshold voltage Vth of the memory cell transistor, which stores the "00" data, is Vth<Vth3.

Compared to the write mode of the single-level NAND flash memory (hereinafter referred to as "2-value mode"), the 4-value NAND flash memory of the present embodiment may be referred to as an operation mode in which a lower bit and an upper bit are used.

An external controller (not shown) in the NAND flash memory 10, for instance, executes control to determine which of the 2-value mode and the 4-value mode is used to write data in the memory cell transistors MT0 to MTm+1. Specifically, a lower page address is assigned to the lower bit of the 2-bit data, and an upper page address is assigned to the upper bit. In the case where data is written in the memory cell transistors MT0 to MTm+1 in the 2-value mode, the controller, for instance, writes data by using only the lower page address of these page addresses. In the case where data is written in the memory cell transistors MT0 to MTm+1 in the 4-value mode, the controller, for instance, writes data by using both the upper page address and the lower page address.

The data write in the 4-value mode in this embodiment is first executed from the lower bit. If the erase state is "11" ("− −"; symbol "−" indicates an unfixed value), the data write is first executed for the lower bit. Thereby, the memory cell transistor, MT0 to MTm+1, holds "11" ("−1") or "10" ("−0"). In the case of the 2-value mode, the write is completed by the above process. In the case of the 4-value mode, the write is subsequently executed for the upper bit. As a result, the memory cell transistor, MT0 to MTm+1, which holds "11" ("−1"), holds "11" or "01", and the memory cell transistor, MT0 to MTm+1, which holds "10" ("−0"), holds "10" or "00".

Even in the case of the 4-value data write in the present embodiment, the same write operation in steps ST1 to ST5, which has been described in connection with FIG. 3, is executed. Thus, as shown in FIG. 22, the page read operation can be executed in the state in which all the noise voltages $\Delta Vno1$, $\Delta Vno2$ and $\Delta Vno3$ due to the source line noise are eliminated. As a result, even in the case where a large source line noise has occurred, the read margin voltages can be increased up to $\Delta vm1'$, $\Delta vm2'$ and $\Delta vm3'$.

For example, in the case where the memory cell array 12 is configured as the 4-value NAND flash memory, the ratio of the increase of the read margin is noise voltage value $\Delta vno1$/margin voltage value $\Delta vm1'$, noise voltage value $\Delta vno2$/margin voltage value $\Delta vm2'$, noise voltage value $\Delta vno3$/margin voltage value $\Delta vm3'$, and is about 20%, respectively. In this manner, in the case where the memory cell array 12 is configured as the 4-value NAND flash memory, the noise voltages $\Delta Vno1$, $\Delta Vno2$ and $\Delta Vno3$ are unchanged while the margin voltage between the threshold distributions becomes narrower. Thus, the radio of the increase of the read margin can be made greater.

In the third embodiment, the 4-value NAND flash memory has been described as an example of the multilevel NAND flash memory. However, the multilevel NAND flash memory is not limited to the 4-value NAND flash memory, and the invention is similarly applicable to an 8-value NAND flash memory or a 16-value NAND flash memory. In this case, the ratio of the increase of the margin can be made still greater.

For example, even in the case where the memory cell array 12 is configured as an 8-value NAND flash memory and the present invention is applied to this 8-value NAND flash memory, all the noise voltages $\Delta Vno1$, $\Delta Vno2$, ..., $\Delta Vno7$ due to the source line noise can be eliminated. In this case, similarly, the noise voltages $\Delta Vno1$, $\Delta Vno2$, ..., $\Delta Vno7$ are unchanged while the margin voltages $\Delta vm1'$, $\Delta vm2'$, ..., $\Delta vm7'$ between the threshold distributions become narrower. As a result, in the case of the 8-value NAND flash memory, the radio of the increase of the read margin can be set at, e.g. 30% or more.

In the above description, the floating electrode FG has been exemplified as the charge accumulation layer, but the invention is not limited to this example. For instance, the invention is similarly applicable to cases where the charge accumulation layer is, instead of the floating electrode FG, a metal-oxide-nitride-oxide-silicon (MONOS) type electrode using a silicon nitride film ($Si_3N_4$ film) as a charge accumulation layer, or a tantalum nitride-aluminum oxide-nitride-oxide-silicon (TANOS) type electrode using a control electrode of a tantalum nitride film and a high-dielectric-constant film, such as an alumina ($Al_2O_3$ film) as a charge accumulation layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array having a plurality of memory cell strings arranged along a first direction respectively, each of the memory cell strings including a plurality of memory cells having current paths connected in series along a second direction which is perpendicular to the first direction, each of the memory cells having a charge accumulation layer and a control electrode, the control electrode extending in the first direction and connected to a memory cell located in an adjacent memory cell string;
    a plurality of bit lines extending in the second direction, each of the bit lines electrically connected to one end of the current path of the associated memory cell string;
    a source line extending in the first direction and electrically connected to the other end of the current paths of the memory cell strings;
    a sense amplifier including a plurality of sense amplifier circuits, each of the sense amplifier circuit electrically connected to one of the bit lines, respectively;
    a data buffer including a plurality of first latch circuits, each of the first latch circuits electrically connected to one of the bit lines;
    an input terminal holding data from an external device; and
    a control circuit executing a first verify write operation and a second verify write operation;
    the first verify write operation including,
        loading data from the input terminal to each of the first latch circuits,
        writing each loaded data in the first latch circuits to one of the memory cells connected one of the bit lines, respectively,
        reading the written data of the memory cells into the sense amplifier circuits,
        verifying whether threshold voltages based on the written data are larger than a predetermined voltage, and
        rewiring to a memory cell storing a written data having a threshold voltage which is smaller than the predetermined voltage; and
    the second verify write operation including,
        reloading the data from the input terminal to each of the first latch circuits,
        restoring the written data of the memory cells into the sense amplifier circuits,
        comparing first values of the reloaded data stored in the first latch circuits and second values of the restored data stored in the sense amplifier circuits, and
        rewriting to each reloaded data to one of the memory cells connected one of the bit lines, respectively, when the first value is not same as the second value.

2. The device according to claim 1, wherein the control circuit controls the voltage generating circuit in such a manner that a maximum value of a write voltage at a time of the second verify write operation is less than a maximum value of a write voltage at a time of the first verify write operation.

3. The device according to claim 2, wherein the maximum value of the write voltage at the time of the second verify write operation is about ⅓ to ½ of the maximum value of the write voltage at the time of the first verify write operation.

4. The device according to claim 1, wherein the control circuit controls the voltage generating circuit in such a manner that a step-up width of a write voltage at a time of the second verify write operation is greater than a step-up width of a write voltage at a time of the first verify write operation.

5. The device according to claim 1, wherein the control circuit controls the voltage generating circuit in such a manner that a number of times of step-up at a time of the second verify write operation is less than a number of times of step-up at a time of the first verify write operation.

6. The device according to claim 1, wherein the memory cell array is an area which is capable of recording multi-bit data in each of the memory cells.

7. The device according to claim 1, further comprising a row decoder which selects a plurality of said word lines in the memory cell array, and applies a voltage.

8. The device according to claim 1, further comprising a column decoder which supplies data that is input from the data input/output terminal to a predetermined said first latch circuit in the data buffer.

9. The device according to claim 1, wherein the memory cell array includes first and second select transistors which are connected to one end and the other end of the current path of the memory cell string and select the memory cell string.

10. A write method of a semiconductor memory device, comprising:
    executing a first verify write operation including
        loading data from an input/output terminal to each of first latch circuits,
        writing each loaded data in the first latch circuits to a memory cell connected one of bit lines, respectively,
        reading the written data of the memory cells into the sense amplifier circuits, each of the sense amplifier circuits connected one of the bit lines, respectively,
        verifying whether threshold voltages based on the written data are larger than a predetermined voltage, and
        rewiring to a memory cell storing a written data having a threshold voltage which is smaller than the predetermined voltage; and executing a second verify write operation including
    reloading the data from the input/output terminal to each of the first latch circuits,
    restoring the written data of the memory cells into the sense amplifier circuits,
    comparing first values of the reloaded data stored in the first latch circuits and second values of the restored data stored in the sense amplifier circuits, and
    rewriting to each reloaded data to one of the memory cells connected one of the bit lines, respectively, when the first value is not same as the second value.

11. The write method according to claim 10, wherein a maximum value of a write voltage at a time of the second verify write operation is less than a maximum value of a write voltage at a time of the first verify write operation.

12. The write method according to claim 10, wherein a step-up width of a write voltage at a time of the second verify write operation is greater than a step-up width of a write voltage at a time of the first verify write operation.

13. The write method according to claim 10, wherein a number of times of step-up at a time of the second verify write operation is less than a number of times of step-up at a time of the first verify write operation.

14. The write method according to claim 10, further comprising executing verify read from the memory cells after the second verify write operation is executed.

15. The write method according to claim 14, further comprising executing a third verify write operation including,
 reloading the data from the input/output terminal to each of the first latch circuits
 restoring the written data of the memory cells into the sense amplifier circuits,
 comparing first values of the reloaded data stored in the first latch circuits and second values of the restored data stored in the sense amplifier circuits, and
 rewriting to each reloaded data to one of the memory cells connected one of the bit lines, respectively, when the first value is not same as the second value.

16. A semiconductor memory device comprising:
 a memory cell array having a plurality of memory cell strings arranged along a first direction respectively, each of the memory cell strings including a plurality of memory cells having current paths connected in series along a second direction which is perpendicular to the first direction, each of the memory cells having a charge accumulation layer and a control electrode, the control electrode extending in the first direction and connected to a memory cell located in an adjacent memory cell string;
 a plurality of bit lines extending to the second direction, each of the bit lines electrically connected to one end of the current path of the associated memory cell string;
 a source line extending in the first direction and electrically connected to the other end of the current paths of the memory cell strings;
 a sense amplifier including a plurality of sense amplifier circuits, each of the sense amplifier circuit electrically connected to one of the bit lines, respectively;
 a first date buffer including a plurality of first latch circuits, each of the first latch circuits electrically connected to one of the bit lines, respectively;
 a second data buffer including a plurality of second latch circuits, each of the second latch circuits electrically connected to one of the first latch circuits, respectively; and
 a control circuit executing a first verify write operation and a second verify write operation,
 the first verify write operation including,
  loading data from an external device to the first and second latch circuits,
  writing each loaded data in the first latch circuits to one of the memory cells connected one of the bit lines, respectively,
  reading the written data of the memory cells into the sense amplifier circuits,
  verifying whether threshold voltages based on the written data are larger than a predetermined voltage, and
  rewiring to a memory cell storing a written data having a threshold voltage which is smaller than the predetermined voltage; and
 the second verify write operation including,
  reloading the data from the second latch circuits to the first latch circuits,
  restoring the written data of the memory cells into the sense amplifier circuits,
  comparing first values of the reloaded data stored in the first latch circuits and second values of the restored data stored in the sense amplifier circuits, and
  rewriting to each reloaded data to one of the memory cells connected one of the bit lines, respectively, when the first value is not same as the second value.

17. The device according to claim 16, wherein the control circuit controls the voltage generating circuit in such a manner that a maximum value of a write voltage at a time of the second verify write operation is less than a maximum value of a write voltage at a time of the first verify write operation.

18. The device according to claim 16, wherein the control circuit controls the voltage generating circuit in such a manner that a step-up width of a write voltage at a time of the second verify write operation is greater than a step-up width of a write voltage at a time of the first verify write operation.

19. The device according to claim 16, wherein the control circuit controls the voltage generating circuit in such a manner that a number of times of step-up at a time of the second verify write operation is less than a number of times of step-up at a time of the first verify write operation.

20. A write method of a semiconductor memory device, comprising:
 executing a first verify write operation including
  loading data to first latch circuits and second latch circuit,
  writing each loaded data in the first latch circuits to a memory cell connected one of bit lines, respectively,
  reading the written data of the memory cells into the sense amplifier circuits, each of the sense amplifier circuits connected one of the bit lines, respectively,
  verifying whether threshold voltages based on the written data are larger than a predetermined voltage, and
  rewiring to a memory cell storing a written data having a threshold voltage which is smaller than the predetermined voltage, and executing a second verify write operation including
 reloading the data from the second latch circuit to the first latch circuits,
 restoring the written data of the memory cells into the sense amplifier circuits,
 comparing first values of the reloaded data stored in the first latch circuits and second values of the restored data stored in the sense amplifier circuits, and
 rewriting to each reloaded data to one of the memory cells connected one of the bit lines, respectively, when the first value is not same as the second value.

21. The write method according to claim 20, further comprising executing verify read from the memory cells after the second verify write operation is executed.

22. The write method according to claim 20, further comprising:

executing a third verify write operation including, reloading the data from the input/output terminal to each of the first latch circuits, restoring the written data of the memory cells into the sense amplifier circuits, comparing first values of the reloaded data stored in the first latch circuits and second values of the restored data stored in the sense amplifier circuits, and rewriting to each reloaded data to one of the memory cells connected one of the bit lines, respectively, when the first value is not same as the second value.

* * * * *